US005592409A

United States Patent [19]
Nishimura et al.

[11] Patent Number: 5,592,409
[45] Date of Patent: Jan. 7, 1997

[54] NONVOLATILE MEMORY

[75] Inventors: Kiyoshi Nishimura; Hideki Hayashi; Jun Muramoto; Takaaki Fuchikami; Hiromi Uenoyama, all of Kyoto, Japan

[73] Assignee: Rohm Co., Ltd., Japan

[21] Appl. No.: 374,216

[22] Filed: Jan. 18, 1995

[30] Foreign Application Priority Data

| Jan. 18, 1994 | [JP] | Japan | 6-003796 |
| Jan. 18, 1994 | [JP] | Japan | 6-003797 |
| Apr. 20, 1994 | [JP] | Japan | 6-081481 |
| Dec. 22, 1994 | [JP] | Japan | 6-319922 |

[51] Int. Cl.⁶ ............................................. G11C 11/22
[52] U.S. Cl. .................. 365/145; 365/189.09; 257/295
[58] Field of Search .............................. 365/145, 184, 365/185.01, 189.09; 257/295

[56] References Cited

U.S. PATENT DOCUMENTS

| 4,873,664 | 10/1989 | Eaton, Jr. | 365/145 |
| 4,888,733 | 12/1989 | Mobley | 365/145 |
| 5,303,182 | 4/1994 | Nakao et al. | 365/145 |
| 5,341,010 | 8/1994 | Shimoji | 365/184 |
| 5,345,414 | 9/1994 | Nakamura | 365/145 |
| 5,412,596 | 5/1995 | Hoshiba | 365/145 |

Primary Examiner—Viet Q. Nguyen
Assistant Examiner—Huan Hoang
Attorney, Agent, or Firm—Merchant, Gould, Smith, Edell, Welter & Schmidt

[57] ABSTRACT

Nonvolatile memory with a simple structure where recorded information can be read without destruction: Voltage is impressed between control gate CG and memory gate MG at a writing operation. A ferroelectric layer 32 is polarized in accordance with the direction of the impressed voltage. The control gate voltage $V_{CG}$ to make a channel is low when the ferroelectric layer 32 is polarized with the control gate side being positive (polarized with second status). The control gate voltage $V_{CG}$ to make a channel is high when the ferroelectric layer 32 is polarized with the control gate side being negative (polarized with the first status). The reference voltage $V_{ref}$ is impressed to the control gate CG at the reading operation. A high drain current flows when the ferroelectric layer is polarized with the second status and low drain current flows when the ferroelectric layer is polarized with the first status. Recorded information can be read by detecting the drain current. With this reading operation, the polarization status is not destroyed.

24 Claims, 31 Drawing Sheets

FIG. 6

APPLIED VOLTAGES WHEN MEMORY DEVICE M22 IS SELECTED

STANDBY MODE

| | |
|---|---|
| CGL1: open | SL1: open / MGL1:$V_{ref2}$ MGL2:$V_{ref2}$ MGL3:$V_{ref2}$ |
| CGL2: open | SL2: open / MGL1:$V_{ref2}$ MGL2:$V_{ref2}$ MGL3:$V_{ref2}$ |
| CGL3: open | SL3: open / MGL1:$V_{ref2}$ MGL2:$V_{ref2}$ MGL3:$V_{ref2}$ |

WRITE MODE

| | |
|---|---|
| CGL1: open | SL1: open / MGL1:$V_{ref2}$ MGL2:VDD/GND MGL3:$V_{ref2}$ |
| CGL2: VTH | SL2: GND / MGL1:$V_{ref2}$ MGL2:VDD/GND MGL3:$V_{ref2}$ |
| CGL3: open | SL3: open / MGL1:$V_{ref2}$ MGL2:VDD/GND MGL3:$V_{ref2}$ |

READ MODE

POSSIBLE DRAIN CURRENT (DRAIN CURRET CAPACITY)

| | | |
|---|---|---|
| CGL1: open | SL1: open / MGL1:$V_{ref2}$ MGL2:open MGL3:$V_{ref2}$ | I=0 (M11) <br> I=0 (M21) <br> I=0 (M31) |
| CGL2: VTH | SL2: GND / MGL1:$V_{ref2}$ MGL2:open MGL3:$V_{ref2}$ | I=I0 (M12) <br> I=I0max or 0 (M22) <br> I=I0 (M32) |
| CGL3: open | SL3: open / MGL1:$V_{ref2}$ MGL2:open MGL3:$V_{ref2}$ | I=0 (M13) <br> I=0 (M23) <br> I=0 (M33) |

F I G. 7
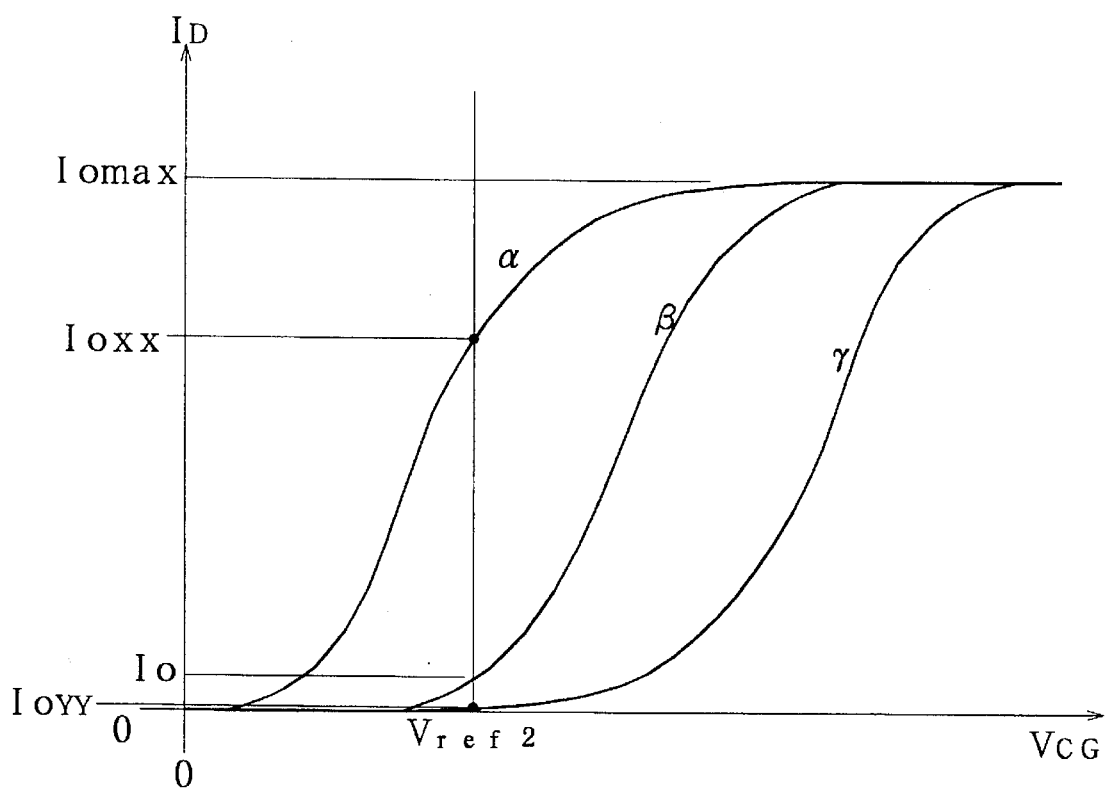

GENERATING CIRCUIT FOR
REFERENCE VOLTAGE

JUDGING CIRCUIT FOR DRAIN CURRENT

READ OPERATION MODE

F I G. 14

|  | WRITE | READ | STAMDBY |
|---|---|---|---|
| R/W | L | H | — |
| IN | HorL | — | — |
| OUT | — | HorL | — |
| $C_1$ | L | L | L |
| $C_2$ | H | H | L |
| $L_1$ | L | L | L |
| $L_2$ | H | H | L |

WRITE MODE

READ OPERATION MODE

READ OPERATION MODE

STANDBY MODE

STANDBY MODE

WRITE MODE

READ OPERATION MODE

READ OPERATION MODE

STANDBY MODE

NONVOLATILE MEMORY

BACKGROUND OF THE INVENTION

1. Field of the Invention

The present invention relates to nonvolatile memory.

2. Description of the Prior Art

Recently, a nonvolatile memory device using a ferroelectric property is getting attention in the industry, and several structures of the device and circuit configurations for the device are proposed. FIG. 1 shows a structure of a nonvolatile memory cell which is disclosed in U. S. Pat. No. 4,888,733. In the figure, a transistor 18 and a transistor 20 are connected to opposite sides of a ferroelectric capacitor 2. Gates of the transistor 18 and the transistor 20 are connected with a word line 8. Also, a source of the transistor 18 is connected to a bit line 14, and a source of the transistor 20 is connected with a bit line 16.

The ferroelectric capacitor 2 is polarized when a certain voltage is applied between the bit line 14 and the bit line 16 after turning on the transistor 18 and the transistor 20. Polarization of the ferroelectric capacitor 2 is maintained even after suspending the applied voltage. Direction of polarization can be turned over by applying a voltage in the opposite direction. Accordingly, the ferroelectric capacitor 2 is able to store data under a nonvolatile condition.

When read out of the stored data from the capacitor is performed, a certain voltage is applied to the ferroelectric capacitor 2. Upon applying the voltage to the ferroelectric capacitor 2, memorized polarization can be known by detecting whether the polarization turns over or not. In other words, memorized polarization can be known by detecting a current which flows by turning over the polarization. Since the memorized polarization is changed (i.e. stored data is erased) when read out of the data from the ferroelectric capacitor 2 is performed, the same data (as the stored data) is written into the ferroelectric capacitor immediately after reading to maintain the polarization direction.

Furthermore, another nonvolatile memory device utilizing ferroelectric capacitors consisting of 2 ferroelectric capacitors and 2 transistors, is proposed (disclosed in U.S. Pat. No. 4,873,664).

However, the above mentioned nonvolatile memory devices have the following issues to resolve.

First, the memory device disclosed in U. S. Pat. No. 4,888,733 requires 2 transistors in addition to the ferroelectric capacitor for each cell. Therefore, structure of the memory device is complicated. In addition, the memory device disclosed in U. S. Pat. No. 4,873,664 requires 2 transistors and 2 ferroelectric capacitors for each cell, so that construction of the device is too complex.

Further, since the stored data in the ferroelectric capacitor is erased when reading out the data as described above, the same data (as the stored data) must be re-written into the capacitor, so that control of the read operation is complex.

SUMMARY OF THE INVENTION

It is an object of the present invention to provide a nonvolatile memory device which can read out stored data under a nondestructive condition and with simple structure.

A nonvolatile memory formed by nonvolatile memory devices connected in matrix in accordance with the present invention is provided:

wherein said nonvolatile memory devices comprises:

a source region of first conductive type and a drain region of first conductive type, a channel region of a second conductive type formed between the source and the drain regions, a memory gate formed on the channel region and insulated from the channel region, a ferroelectric layer formed on the memory gate, and a control gate formed on the ferroelectric layer; and wherein said nonvolatile memory comprises, a drain line which connects the drain regions of the nonvolatile memory devices in same line of the matrix, a unified drain line which connects the drain lines of predetermined lines of the matrix, a memory gate line which connects the memory gates of the nonvolatile memory devices in same line of the matrix, a source line which connects the source regions of the nonvolatile memory devices in same column of the matrix, and a control gate line which connects the control gates of the nonvolatile memory devices in same column of the matrix.

While the novel features of the invention are set forth in a general fashion, both as to organization and content, it will be better understood and appreciated, along with other objects and features thereof, from the following detailed description taken in conjunction with the drawings.

BRIEF DESCRIPTION OF THE DRAWINGS

FIG. 6 is a table showing applied voltage to the circuitry of FIG. 2 in each operational mode.

FIG. 7 is a graph for showing a reference voltage $V_{ref2}$ used in another embodiment.

FIG. 14 is a table showing applied voltage to the circuitry of FIG. 11 in each operational mode.

DESCRIPTION OF THE PREFERRED EMBODIMENTS

Figure 3:
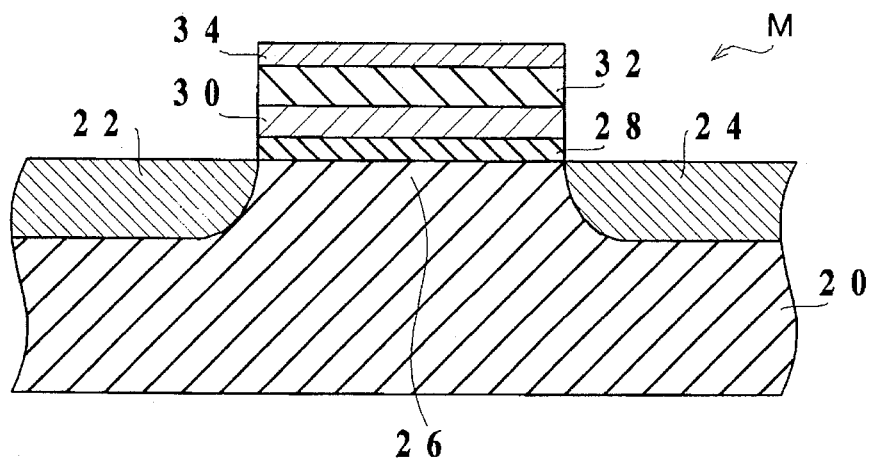
FIG. 3 shows structure of nonvolatile memory device M used in the nonvolatile memory of FIG. 2.

Referring to FIG. 3, nonvolatile memory device M used in the preferred embodiments will be described. FIG. 3 shows a structure of an nonvolatile memory device M as an embodiment in the present invention. In the device M, a source region 22 and a drain region 24 are formed in a silicon substrate 20. An insulation layer 28 made of silicon oxide (SiO2) or silicon nitride (SiN), etc. is formed on a channel region 26 in the silicon substrate 20. A lower conducting layer (memory gate) 30 made of platinum or the like is formed on the insulation layer 28. A ferroelectric layer 32 made of $PbZr_xTi_{1-x}O_3$(PZT), etc. is formed on the lower conducting layer 30 and an upper conducting layer (control gate) 34 made of platinum or the like is formed on the layer 32. The lower conducting layer 30 or the upper conducting layer 34 may be oxided conducting material such as RuOx, IrOx, ITO or metal material such as Pb, Au, Ag, Al, and Ni, instead of the platinum as described above.

Figure 4:
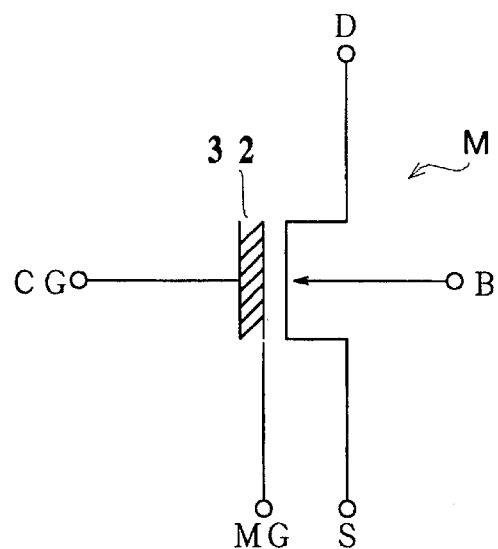
FIG. 4 shows a symbol of the nonvolatile memory device M of FIG. 3.

FIG. 4 shows a symbol of the nonvolatile memory device M shown in FIG. 3. A control gate electrode CG is connected to the upper conducting layer 34 and a memory gate electrode MG is connected to the lower conducting layer 30. Also, a source electrode S is connected to the source region 22 and a drain electrode D is connected to the drain region 24.

A certain voltage is applied between the control electrode CG and the memory gate MG when a data is stored into the nonvolatile memory device M. Consequently, the ferroelectric layer 32 of the memory device M is polarized and the polarization is maintained even though application of the voltage is suspended. Namely, it is possible to obtain two opposite polarization states according to polarity of the applied voltage. For example, when low voltage as compared with a voltage applied to the control gate CG is applied to the memory gate electrode, the ferroelectric layer 32 is polarized as the control gate side assumes negative polarity (defined as first polarization state). On the other hand, when high voltage as compared with a voltage applied to the control gate CG is applied to the memory gate electrode, the ferroelectric layer 32 is polarized as the control gate side assumes positive polarity (defined as second polarization state). Thus, two states can be memorized in the memory device M having the ferroelectric layer 32 with a nonvolatile condition. In other words, information (data) corresponding to the two states can be memorized in the memory device M.

When the ferroelectric layer 32 is polarized as the control gate side assumes positive polarity (second polarization state), the necessary applied voltage of control gate CG to form a channel in the channel region is low. On the other hand, when the ferroelectric layer 32 is polarized as the control gate side assumes negative polarity (first polarization state), the necessary applied voltage of control gate CG to form a channel in the channel region is high. Therefore, it is possible to read out the stored information (data) by detecting whether the channel is formed or not in the channel region 26 by means of applying an intermediate voltage between the necessary voltage of the control gate in first polarization state and that in second polarization state.

Figure 5A:
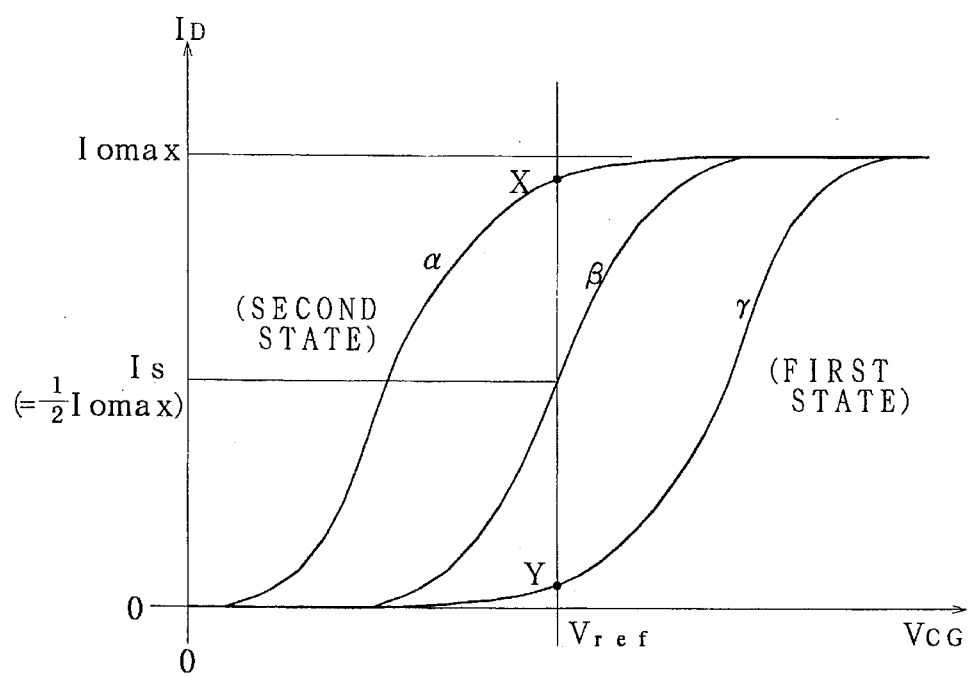
FIG. 5A shows an electric characteristic of the nonvolatile memory device M.
Figure 5B:
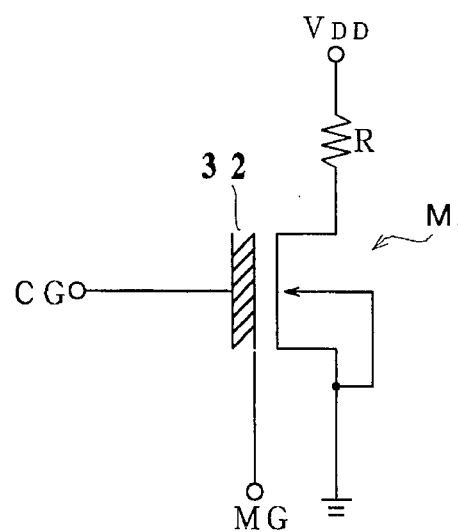
FIG. 5B shows a test circuit in which the electric characteristic of the nonvolatile memory is measured.

The relationship between the first and the second polarization states will be explained referring to FIG. 5A which shows the electric characteristics of the memory device M measured by a circuit shown in FIG. 5B. In FIG. 5A, a curve β shows an characteristics between a control gate voltage $V_{CG}$ and a drain current $I_D$ when the control gate electrode CG and the memory gate electrode MG are electrically connected (short-circuited). The drain current $I_D$ increases when the control gate voltage $V_{CG}$ increases. When the control gate voltage $V_{CG}$ further increases, the drain current $I_D$ reaches an established maximum drain current $I_{OMAX}$ determined by the value of a resistance R.

Curve α shows an electric characteristics that the ferroelectric assumes polarized as the control gate CG is the negative polarity (under the second state). Although the curve a shows similar characteristics as the curve P, the drain current starts to flow from a low control gate voltage $V_{CG}$ because of an influence of the polarization of the ferroelectric layer 32. Also, the drain current reaches an established maximum drain current $I_{OMAX}$ at a low control voltage $V_{CG}$.

Curve γ shows characteristics that the ferroelectric is polarized as the control gate CG assumes the negative polarity (under the first state). The curve y shows similar characteristics as the curve P, the drain current starts to flow at higher control gate voltage $V_{CG}$ because of an influence of the polarization of the ferroelectric layer 32. Also, the drain current reaches an established maximum drain current $I_{OMAX}$ at a high control voltage $V_{CG}$.

When read out from the device M is performed, a control gate voltage corresponding to a drain current (hereinafter referred to as reference current) Is which is half the value of the established maximum drain current $I_{OMAX}$, is applied to the control gate CG as a reference voltage $V_{ref}$. The stored information can be known by judging whether or not the drain current $I_D$ is higher (see point X in FIG. 5A) than the reference current Is (see point Y in FIG. 5A).

Figure 1:
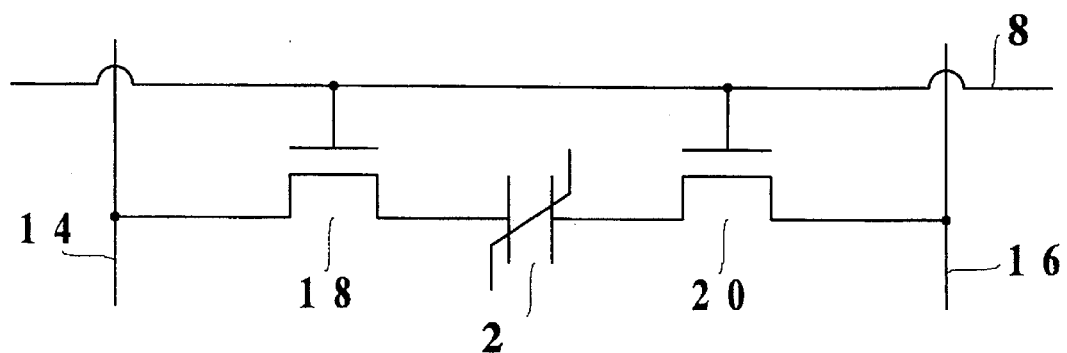
FIG. 1 shows circuitry of nonvolatile memory in the prior art.
Figure 2:
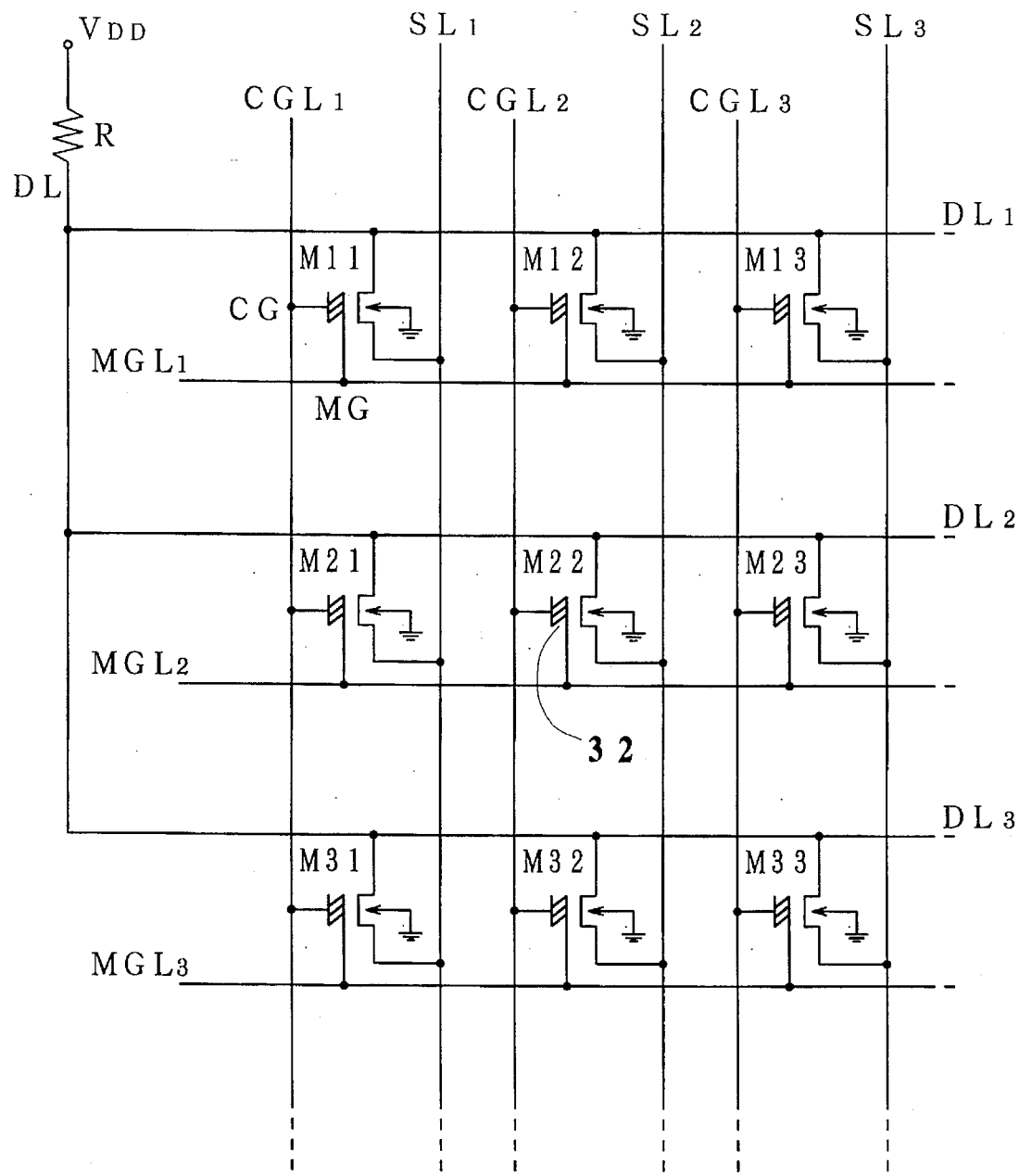
FIG. 2 shows circuitry of nonvolatile memory in an embodiment of the present invention.

FIG. 2 shows nonvolatile memory in which the nonvolatile memory devices of FIG. 4 are connected as a matrix. Each drain electrode D of the memory devices(for example, $M_{11}$, $M_{12}$, $M_{13}$ . . . ) of the same line in each column are connected to a drain line $DL_1$, $DL_2$, $DL_3$ . . . , respectively. The drain lines $DL_1$, $DL_2$, $DL_3$ . . . are connected to a unified drain line DL which is connected to source voltage $V_{DD}$ through a resistor R.

Each control gate electrode CG of the memory devices-(for examples, $M_{11}$, $M_{21}$, $M_{31}$ . . . ) of the same column in each line are connected to a control gate line $CGL_1$, $CGL_2$, $CGL_3$ ..., respectively. Each source electrode S of memory devices (for example, $M_{12}$, $M_{22}$, $M_{32}$ ... ) of the same column in each line are connected to a source line $SL_1$, $SL_2$, $SL_3$ ..., respectively. Further, each memory gate electrode MG of the memory devices (for example, $M_{11}$, $M_{12}$, $M_{13}$ ... ) of the same line in each column are connected to a memory gate line $MGL_1$, $MGL_2$, $MGL_3$ ..., respectively.

The write to or read from mode of selected memory device $M_{22}$ or the standby mode will be described with reference to FIG. 6 which shows applied voltage to each line in write, read or standby operation mode.

In the write operation mode, the control gate line $CGL_2$, which is connected to the selected memory device $M_{22}$, is applied with the reference voltage $V_{ref}$, and the other control gate lines $CGL_1$, $CGL_3$ ... are of floating status. The source line $SL_2$ is grounded, and the other source lines $SL_1$, $SL_3$ ... are of floating status. The memory gate line $MGL_2$ is applied with writing voltage (5 V or ground) corresponding to information to be recorded, and the other memory gate lines $MGL_1$, $MGL_3$ ... are applied with reference voltage $V_{ref}$. By applying such voltage only to the ferroelectric film 32 of the selected memory device $M_{22}$, writing voltage is applied and the ferroelectric film 32 is polarized. In other words, the ferroelectric film 32 of the selected memory device $M_{22}$ is polarized into a first state or second state in accordance with the writing voltage.

In the read operation mode, the control gate line $CGL_2$, which is connected to the selected memory device $M_{22}$, is applied with reference voltage $V_{ref}$, and the other control gate lines $CGL_1$, $CGL_3$ ... are of floating status. The source line $SL_2$ is grounded, and the other source lines $SL_1$, $SL_3$ ... are of floating status. The memory gate line $MGL_2$ is of floating status, and the other memory gate lines $MGL_1$, $MGL_3$ ... are applied with reference voltage $V_{ref}$.

Only to the control gate line $CGL_2$ is the reference voltage $V_{ref}$ applied. Therefore, in the unselected memory devices $M_{11}$, $M_{21}$, $M_{31}$, $M_{13}$, $M_{23}$, $M_{33}$ ... connected to the other control gate lines $CGL_1$, $CGL_3$ ..., drain current does not flow. In the selected memory device $M_{22}$, the control gate is applied with the reference voltage $V_{ref}$ and the memory gate is of floating status. Therefore, the value of drain current $I_D$ becomes zero (see point Y of FIG. 5), or maximum $I_{OMAX}$ (see point X of FIG. 5) in accordance with recorded information in the selected memory device $M_{22}$ (in accordance with polarization direction of the memory device $M_{22}$). By judging whether the drain current $I_D$ is more or less than the reference current $I_s$, the recorded information can be read. In the read operation, the recorded information (the direction of polarization) can be maintained and is not destroyed.

Because the reference voltage $V_{ref}$ is applied both to the control gate and memory gate in the unselected memory devices $M_{12}$, $M_{32}$, in such read operation the control and memory gates are of the same state as being connected to each other. Therefore, there is unexpected drain current corresponding to the reference voltage $V_{ref}$ on the curve β of FIG. 5A in the unselected memory devices $M_{12}$, $M_{32}$. When this unexpected drain current is so large, erroneous read operation is carried out. When the memory device has the characteristics shown in FIG. 5A, each unexpected drain current of the unselected memory devices $M_{12}$, $M_{32}$ becomes $I_{OMAX/2}$ and the unexpected drain currents cause the erroneous operation.

To prevent such erroneous operation, suppressed reference voltage $V_{ref2}$ is used in this embodiment as shown in FIG. 7. The suppressed reference voltage $V_{ref2}$ corresponds to suppressed reference current $I_o$ which is extremely smaller than the reference current $I_s$. By using the suppressed reference voltage $V_{ref2}$, drain current of the unselected memory devices $M_{12}$, $M_{32}$ becomes extremely small relative to $I_o$. Therefore, gathered drain current flowing in the unified drain line DL is approximately $I_{OMAX}$ or zero according to the polarization direction of selected memory device $M_{22}$, and a correct read operation can be carried out. Also in this embodiment, recorded information of the selected memory device $M_{22}$ is read out by judging whether the gathered drain current $I_D$ is more than $(I_{OXX})$ or less than $(I_{OYY})$ the reference current $I_s$ $(=I_{OMAX/2})$, as shown in FIG. 5A. The value of suppressed reference current $I_o$ is preferably extremely smaller than $I_{OMAX/2}K$, when K is the number of memory devices in a column.

For enabling large $I_o$ by reducing the K, the drain lines may be grouped in desired two or more blocks, and two or more unified drain lines may be provided for each block.

As described above, use of the suppressed reference voltage $V_{ref2}$ prevents erroneous read operation. In case of using the suppressed reference voltage $V_{ref2}$ also in the write operation, the suppressed reference voltage $V_{ref2}$ may be enough voltage for dielectric polarization of the ferroelectric layer 32. In this embodiment, the suppressed reference voltage $V_{ref2}$ is approximately 1 V when $V_{DD}$ is 5 V.

As described above, write and read operation can be carried out by the desired memory device.

In the above mentioned embodiment, impressed voltage (reference voltage $V_{ref2}$) to the memory gate MG for writing is of the same value as impressed voltage (reference voltage $V_{ref2}$) to the memory gate MG for reading. Therefore, voltage generation circuits becomes simplified. In another embodiment, impressed voltage for writing may be different in value from impressed voltage for reading, but should be of intermediate voltage corresponding to a current value between the established maximum drain current and zero.

A generation circuit for reference voltage $V_{ref}$ or $V_{ref2}$ is necessary to operate the memory circuit of FIG. 2. As clear by from FIGS. 5 and 7, suitable reference voltage $V_{ref}$ or $V_{ref2}$ corresponding to characteristics of the memory device is necessary to prevent erroneous operation. In this embodiment, a generation circuit 40 for reference voltage is used for obtaining suitable reference voltage $V_{ref2}$, as shown in FIG. 8.

Figure 8:
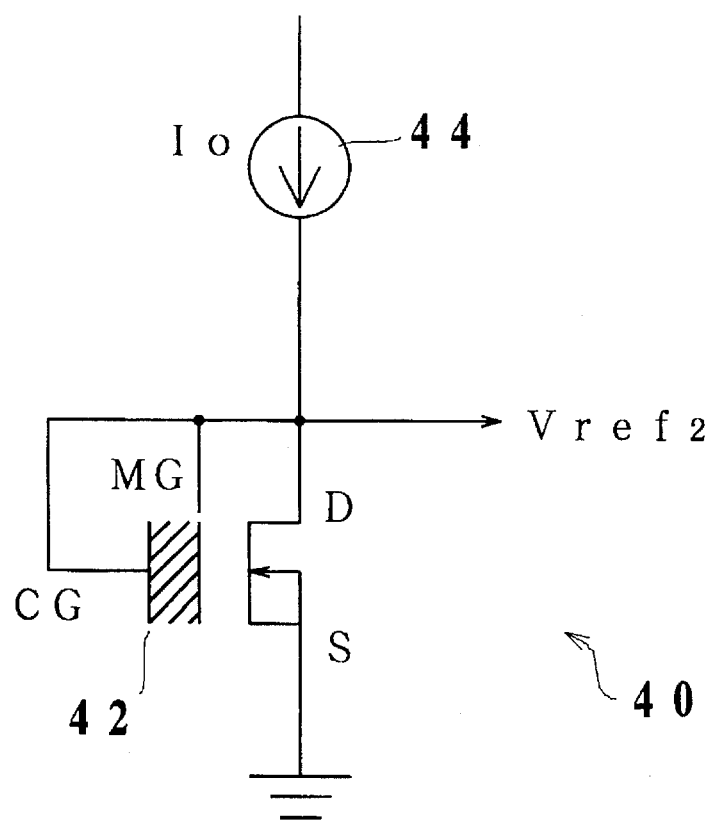
FIG. 8 shows a generation circuit 40 for reference voltage.

In FIG. 8, a device 42 for generating reference voltage is same device as the memory device M which needs the reference voltage. The device 42 is made from the same wafer, in same process and at the same time with the memory device M.

In the reference voltage generating circuit 40, the control gate electrode CG, the memory gate electrode MG and the drain electrode D of the device for generating the reference voltage 42 are connected, and a constant current supply 44 for supplying the suppressed reference current Io (see FIG. 7) is connected to the drain D. Electric characteristics of the device 42 can be described as the curve β in FIG. 7, since the control gate electrode CG and the memory gate electrode MG of the device 42 are short-circuited. Also, the current IO is given to the drain D of the device 42, and the voltage at the control gate electrode CG is the reference voltage $V_{ref2}$. As mentioned above, the device 42 is made from the same wafer, in same process and at the same time with the memory device M. Therefore, when electric characteristics of the memory device M are shifted in the process of production or operation, the electric characteristics of the device 42 follow the characteristics of memory device M so that the reference voltage $V_{ref2}$ can be maintained at the appropriate value relative to the electric characteristics of the memory device M.

When reference voltage $V_{ref1}$ is required instead of $V_{ref2}$, current source 44 which supplies reference current $I_s$ is used. Similar to above, when an intermediate voltage is required, current source 44 which supplies current corresponding to the intermediate voltage is used.

To operate the circuit shown in FIG. 2, a circuit for detecting drain current is required. In the explanation of FIG. 2 described above, stored data of the memory device $M_{22}$ (hereinafter referred to as a selected device) is detected by judging whether the drain current flows in the drain line DL are higher or lower than the reference current $I_s$. Power supply voltage $V_{DD}$ is applied to the drain line DL through the resistor R so as to flow the drain current lower than the reference current $I_s$ if the selected device is polarized under the first state, and to flow the drain current higher than the reference current $I_s$ if the selected device is polarized under the second state. It is possible to carry out the detection by measuring the current flowing in the drain line DL. However, it causes complexity of the circuit.

Figure 9:
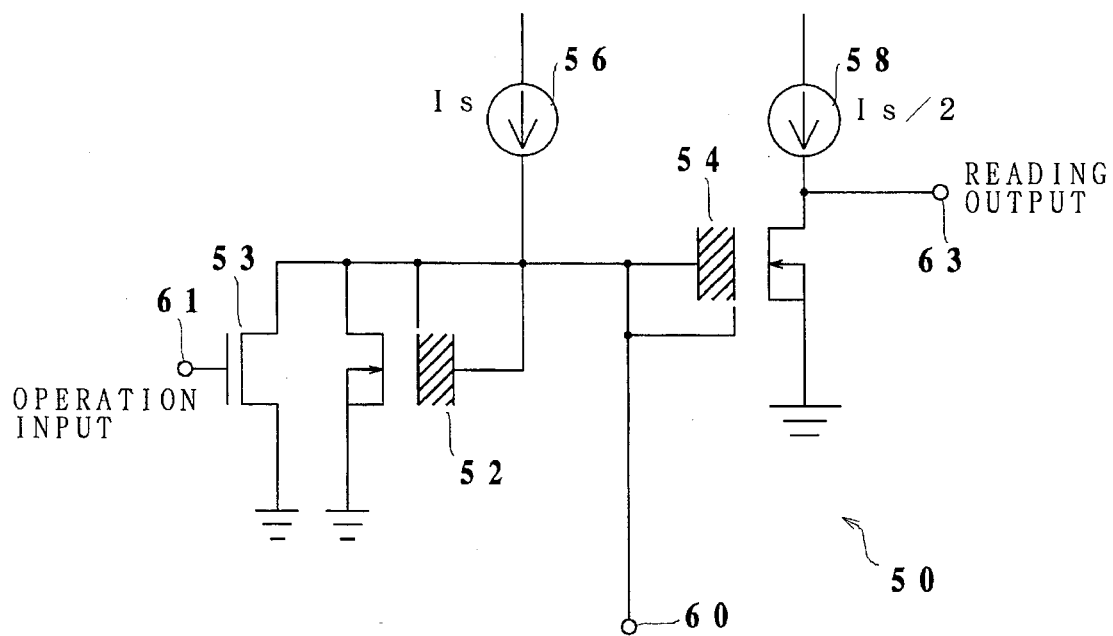
FIG. 9 shows a judgment circuit 50 for the drain current.

To simplify the circuit and carry out accurate detection, a judgment circuit 50 for the drain current shown in FIG. 9 may be used. When the judgment circuit 50 is used for the circuit shown in FIG. 2, the resist or R is not used. First device 52 for current judgment and second device 54 for current judgment are made from the same wafer, in the same process and at the same time with the memory device M. A constant-current source 56 supplies a current $I_s$ that is half the value of the established maximum drain current $I_{OMAX}$, and is connected to drain electrode D of the device 52. Also, a constant-current source 58 supplies a current that is half the value of the current $I_s$, and is connected to drain electrode D of the device 54. A terminal 60 of the circuit 50 is connected to the drain line DL of FIG. 2.

When the selected memory device $M_{22}$ is polarized under the second polarization state and has the capability to flow drain current over the current $I_s$, the current $I_s$ of the constant-current source 56 flows to the memory device $M_{22}$ and does not flow into the device 52. So both device 52 and device 54 are turned to the off state. On the other hand, when the selected memory device $M_{22}$ is polarized under the first polarization state and does not have the capability to flow a drain current over the current $I_s$, most of the current $I_s$ of the constant-current source 56 does not flow to the memory device $M_{22}$ but instead flows into the device 52. So both device 52 and device 54 are turned to the on state. Therefore, an output corresponding to stored data in the selected memory device $M_{22}$ can be obtained from a read-cut output terminal 63. Since both device 56 and device 58 are made from the same wafer, in the same process and at the same time with the memory device M, as is device 42, the probability of error becomes small.

When an input at an operating input terminal 61 is "L" (low level voltage), the judgment circuit 50 is operated as described above because the transistor 53 is turned off. However, when the input at the operating input terminal 61 is "H" (high level voltage), the read-out output terminal 63 is fixed as "L" state. This is because the transistor 53 is turned on by the input and current from the constant-current source 56 flows through the transistor 53.

Figure 10:
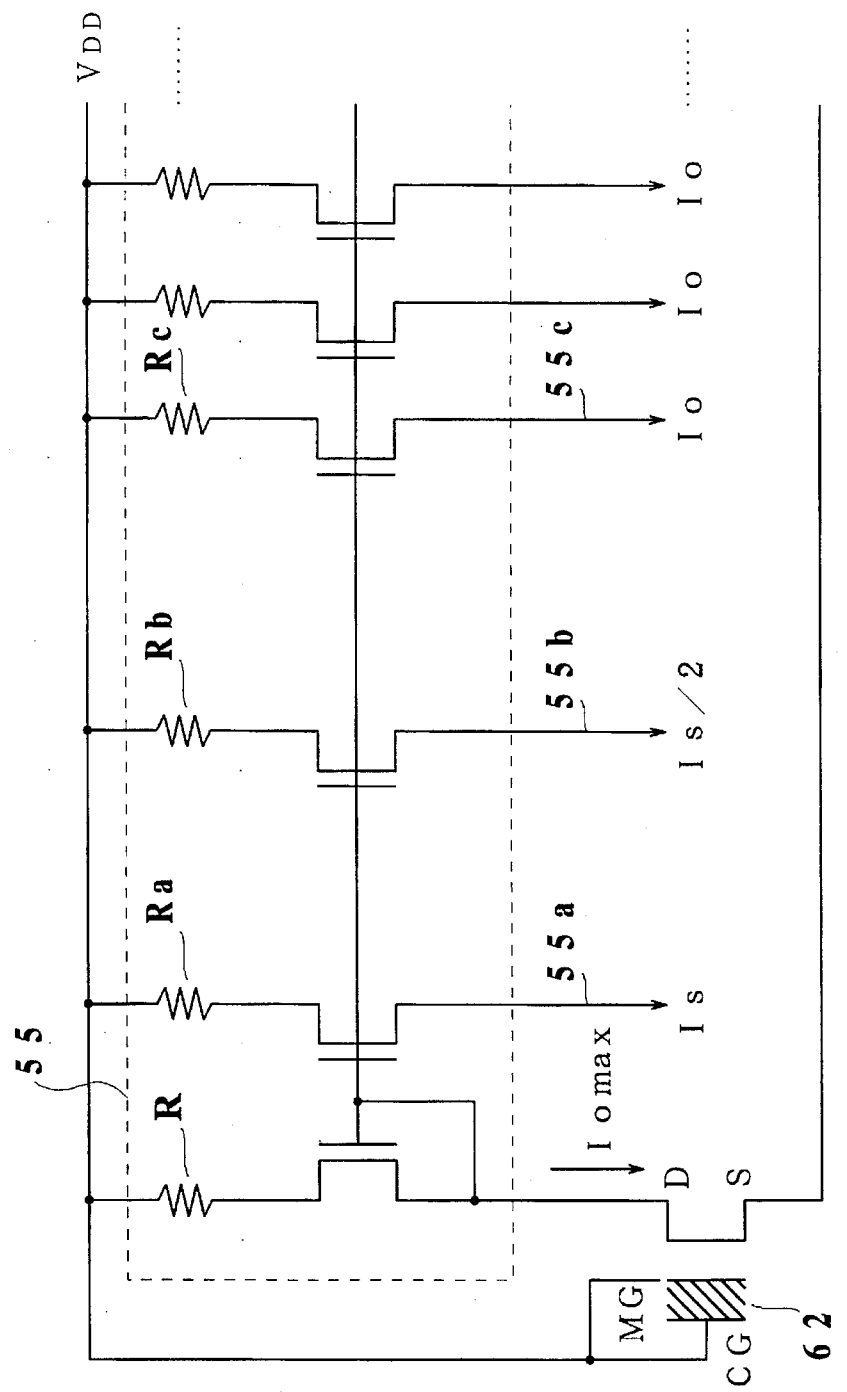
FIG. 10 shows a constant current source.

The constant-current source shown in FIG. 8 and FIG. 9 can be realized under a circuit shown in FIG. 10. In the circuit, a device 62 for generating current is made by the same wafer, in the same process and at the same time with the memory device M. The memory gate electrode MG and the control gate electrode CG of the device 62 are connected and the power Supply $V_{DD}$ is applied to them. Also, an input side of a current mirror circuit 55 is connected to drain electrode D of the device 62. In this way, the established maximum drain current $I_{OMAX}$ corresponds to the shape and capability of the flows to the drain D of the device 62. In addition, a resistor Ra is connected to an output side 55a of the current mirror circuit 55. By selecting a value of resistor Ra, it is possible to obtain the reference current $I_s$ (as half the value of the $I_{OMAX}$).

In the same manner as above, a resistor Rb to obtain half the value of the current $I_s$ (as a quarter of the value of the $I_{OMAX}$) is connected to an output side 55b. Further, a resistor Rc to obtain suppressed reference current Io (see FIG. 7) is connected to an output side 55c.

Although a desired output current is obtained by selecting the value of the resistor in the embodiment described above, it is also possible to obtain the desired output current by adjusting the width of a transistor (transistor width) of the output side. Consequently, it is possible to obtain the current by selecting either or both factors.

In the circuit shown in FIG. 10, the device 62 is made from the same wafer, in the same process and at the same time with the memory device M, and is used to obtain the established maximum drain current $I_{OMAX}$ to generate various outputs currents. In that way, a change in electric characteristics which cause errors can be canceled.

Figure 11:
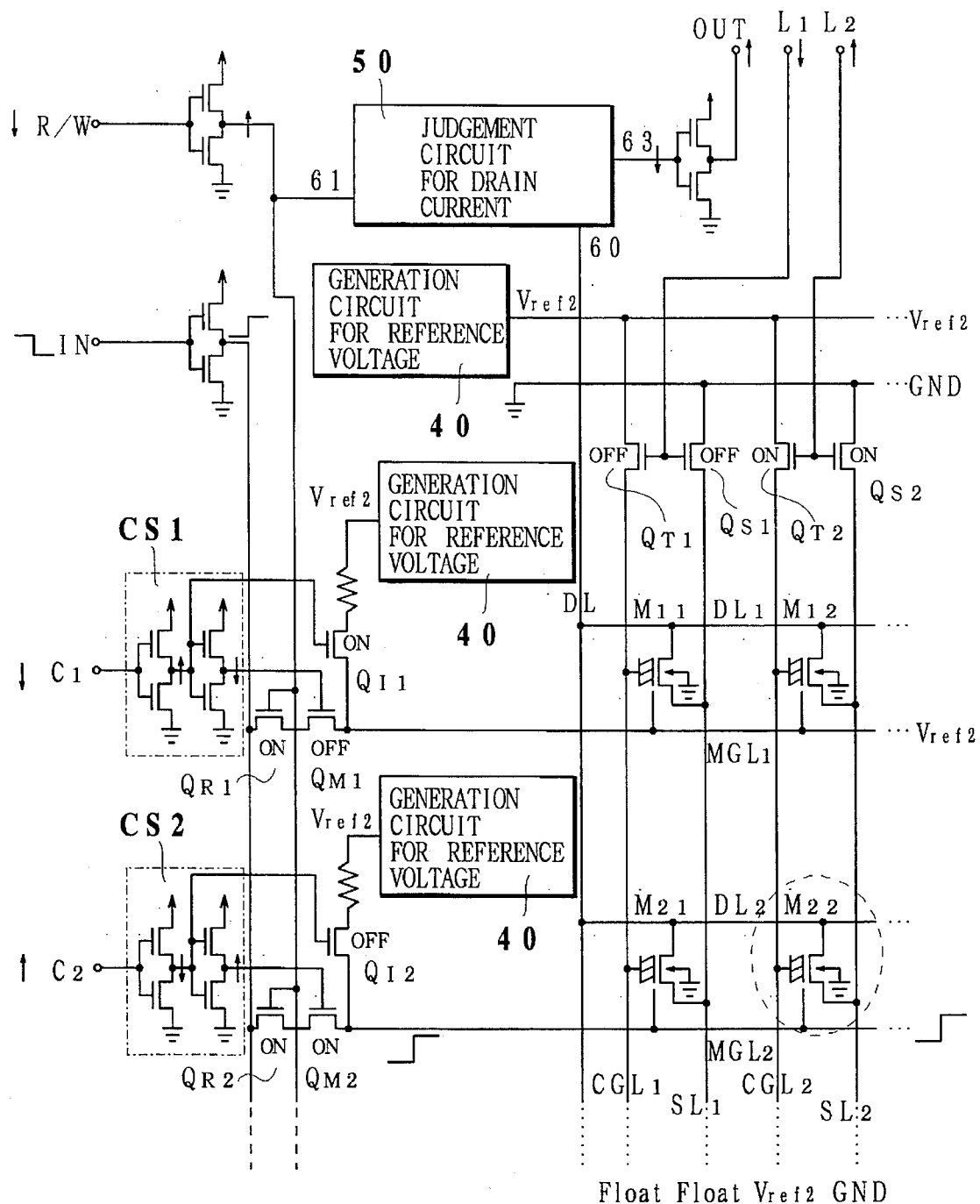
FIG. 11 shows applied voltage to the nonvolatile memory in the write mode of the embodiment of the present invention.

FIG. 11 shows a memory matrix circuit using the generating circuit 40 for reference voltage shown in FIG. 8 and the judgment circuit 50 for drain current. Although in FIG. 11 only 2 lines and 2 columns of matrix are shown for simplification, n lines and n columns matrix may be used.

Applied voltage to each terminal in the write operation mode is shown in FIG. 14. The write operation to the selected memory device $M_{22}$ will be described below. In the write operation, low level voltage (referred as "L") is applied to a terminal R/W, low level voltage or high level voltage (referred as "H") to be recorded is applied to a terminal IN, "L" is applied to a terminal $C_1$, ""H" is applied to a terminal $C_2$, "L " is applied to a terminal $L_1$ and 37 H" is applied to a terminal $L_2$.

Because the terminal R/W is "L ", the operation input terminal 61 of the judgment circuit 50 is maintained with "H" and the judgment circuit 50 does not operate (its output terminal 63 is held to "L ") In this embodiment, "L " is zero volt and "H" is 5 volts. In this embodiment, memory gate switching means is constituted by transistors $Q_{J1}$, $Q_{R1}$, $Q_{M1}(Q_{J2}, Q_{R2}, Q_{M2})$.

"H" is applied only to the terminal $C_2$ which is connected to the line having the selected memory device $M_{22}$ and "L " is applied to the other terminals $C_1$ . . . . First selecting means $CS_2$ connected to the line having the selected memory device $M_{22}$ turns off the transistor $Q_{J2}$. First selecting means $CS_1$ . . . which are not connected to the line having the selected memory device $M_{22}$ turns on the transistor $Q_{J1}$ . . . , respectively. Therefore, the memory gate line $MGL_2$ connected to the selected memory device $M_{22}$ is of floating status and the other memory gate lines $MGL_1$ . . . are impressed with the reference voltage $V_{ref2}$ from the generation circuit 40.

"H" is applied only to the terminal $L_2$ which is connected to the column having the selected memory device $M_{22}$ and "L " is applied to the other terminals $L_1$ . . . . The source switching means $Q_{S2}$ and control gate switching means $Q_{T2}$ in the column having the selected memory device $M_{22}$ become of an ON state and the other source switching means $Q_{S1}$ . . . and the other control gate switching means $Q_{T1}$ become of floating status. Therefore, the source line $SL_2$ having the selected memory device $M_{22}$ is connected to the ground and the other source lines $SL_1$ . . . are of floating status. Also, the control gate line $CGL_2$ having the selected memory device $M_{22}$ is applied with the reference voltage $V_{ref2}$ and the other control gate lines $CGL_1$ . . . are of floating status.

In such status, "'L'" or "'H'" voltage to be recorded is applied to the terminal IN. This write voltage is applied to the memory gate line $MGL_2$ having the selected memory device $M_{22}$ through the transistor $Q_{R2}$ which turns on at "L" of the terminal R/W and the transistor $Q_{M2}$ which turns on at "H" of the terminal $C_2$. This write voltage is not applied to the other memory gate lines MGL, because the terminals $C_1$ . . . are "'L'" and the transistors $Q_{M1}$ . . . turn off.

In the selected memory device $M_{22}$, the reference voltage $V_{ref2}$ is applied to the control gate and the write voltage ("H" or "'L'") is applied to the memory gate. Therefore, the ferroelectric layer of the memory device $M_{22}$ is polarized according to the write voltage to be recorded. The write voltage is also applied to the memory gate of memory devices $M_{21}$ . . . in the same line as the selected memory device $M_{22}$. In these memory devices $M_{21}$ . . . , the control gates are of floating status. Therefore ferroelectric layers of these memory devices $M_{21}$ . . . are not influenced by the writing voltage. The reference voltage $V_{ref2}$ is also applied to the control gate of memory devices $M_{12}$ . . . in the same column as the selected memory device $M_{22}$. Because these memory devices $M_{12}$ are impressed with the reference voltage to the memory gate and not with the write voltage, ferroelectrlic layers of these memory devices $M_{12}$ . . . are not influenced by the writing voltage.

Because the memory devices $M_{11}$ are different from the selected memory device $M_{22}$ in both line and column, the control gate is of floating status and the memory gate is applied with the reference voltage $V_{ref2}$, these ferroelectric layers are not influenced by the writing voltage.

As described above, only the write voltage of the selected memory device can write selectively.

Figure 12:
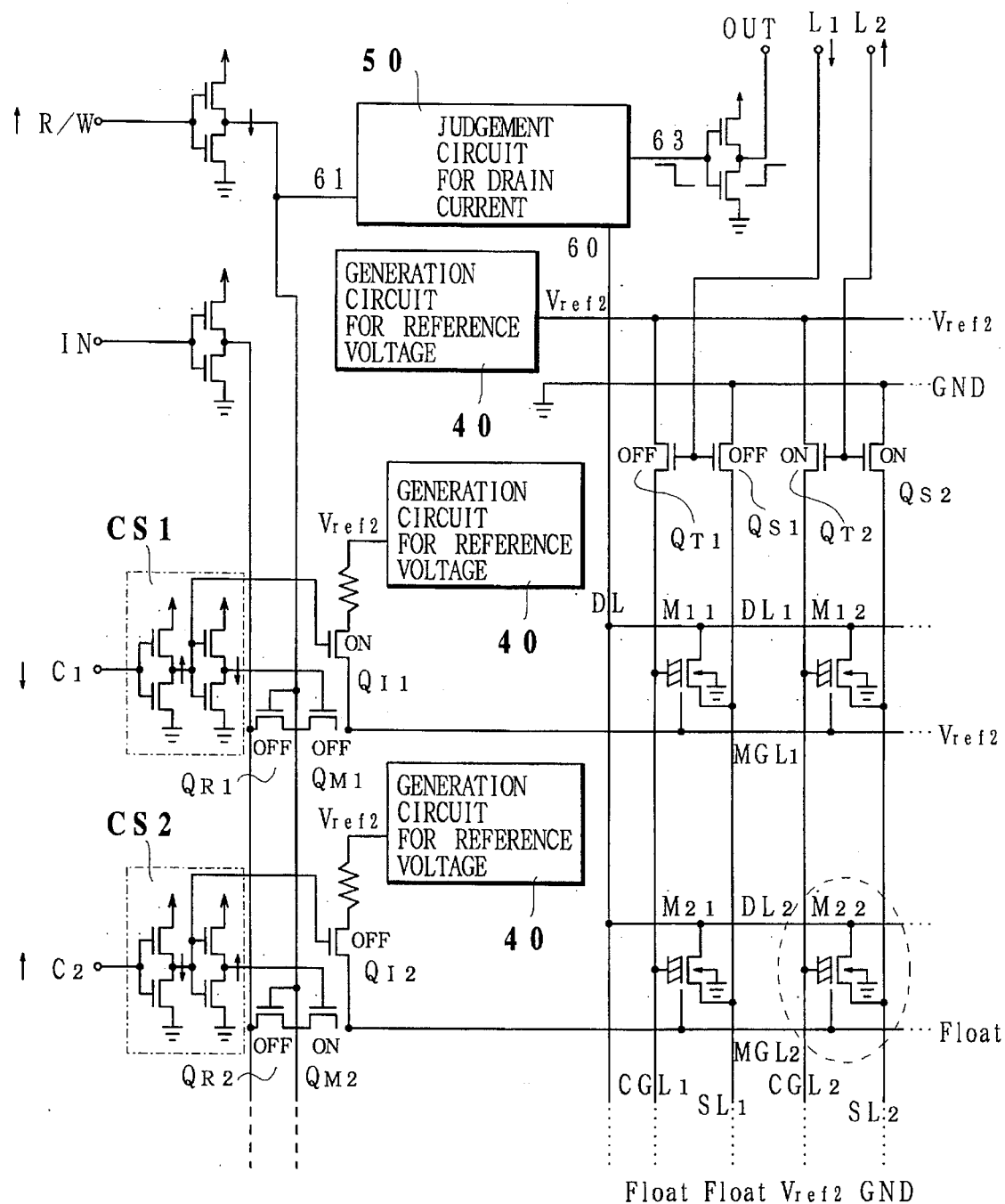
FIG. 12 shows applied voltage to the nonvolatile memory in the read mode of the embodiment of the present invention.

Applied voltage to each terminal in read operation mode is shown in FIG. 14. Read operation to the selected memory device $M_{22}$ will be described below referring to FIG. 12. In the read operation, "H" is applied to the terminal R/W, "L" is applied to a terminal $C_1$, "H" is applied to a terminal $C_2$, "L" is applied to a terminal $L_1$ and "H" is applied to a terminal $L_2$. Read-out voltage can be obtained on a terminal OUT.

Because the terminal R/W is "H", the operation input terminal 61 of the judgment circuit 50 is "L" and the judgment circuit 50 operates. In other words, the judgment circuit 50 reads out the recorded voltage by judging the gathered drain current and outputs the recorded voltage from the terminal OUT. Because the terminal R/W is "H", the transistors $Q_{R1}$, $Q_{R2}$ . . . turn off and the memory gate lines are not influenced by voltage on the terminal IN.

As in the write operation, "H" is applied only to the terminal $C_2$ and the terminal $L_2$. Therefore, the memory gate line $MGL_2$ connected to the selected memory device $M_{22}$ is of floating status and the other memory gate lines $MGL_1$ . . . are impressed with the reference voltage $V_{ref2}$ from the generating circuit 40. Also, the source line $SL_2$ having the selected memory device $M_{22}$ is connected to the ground and the other source lines $SL_1$ . . . are of floating status. Also, the control gate line $CGL_2$ having the selected memory device $M_{22}$ is applied with the reference voltage $V_{ref2}$ and the other control gate lines $CGL_1$ . . . are of floating status.

In the selected memory device $M_{22}$, the memory gate becomes of floating status and the control gate is applied with the reference voltage $V_{ref2}$. Therefore, a channel is formed (see point XX in FIG. 7) when the ferroelectric layer of selected memory device $M_{22}$ is polarized in the second state and a channel is not formed (see point YY in FIG. 7) when the ferroelectric layer of selected memory device $M_{22}$ is polarized in the first state. Because the source of memory device $M_{22}$ is connected to the ground, the memory device $M_{22}$ will have the ability of current flowing in its channel.

Because in the memory devices $M_{21}$ . . . in the same line as the selected memory device $M_{22}$, both the control gate and the memory gate are of floating status, these unselected memory devices $M_{21}$ . . . do not have the ability of current flowing in their channels.

The reference voltage $V_{ref2}$ is also applied to the control gates of memory devices $M_{12}$ . . . in the same column as the selected memory device $M_{22}$. In these unselected memory devices $M_{12}$ . . . , the reference voltage $V_{ref2}$ is applied to the memory gate and the source is connected to the ground. Therefore, an extremely narrow channel is formed which has current flowing ability of $I_o$ in these unselected memory devices $M_{12}$ . . . .

The drain line $DL_2$ connected to the selected memory device $M_{22}$ will have current flowing ability in accordance with the recorded voltage and the other drain lines $DL_1$ . . . will have current flowing ability of $I_o$, respectively. Therefore, unified drain line DL will have total current flowing ability of line DL2 and other lines. As described before, the reference voltage $V_{ref2}$ should be selected to satisfy the corresponding current with the following equation for preventing an erroneous read operation;

$$I_s > I_o \cdot (K-1)$$

where $I_s$ is reference current for judgment and K is a number of lines.

The unified drain line DL is connected to the judgment input terminal 60 of the judgment circuit 50 for drain current. Therefore, the read-out voltage can be obtained from the output terminal OUT in accordance with recorded voltage in the selected memory device $M_{22}$.

Figure 13:
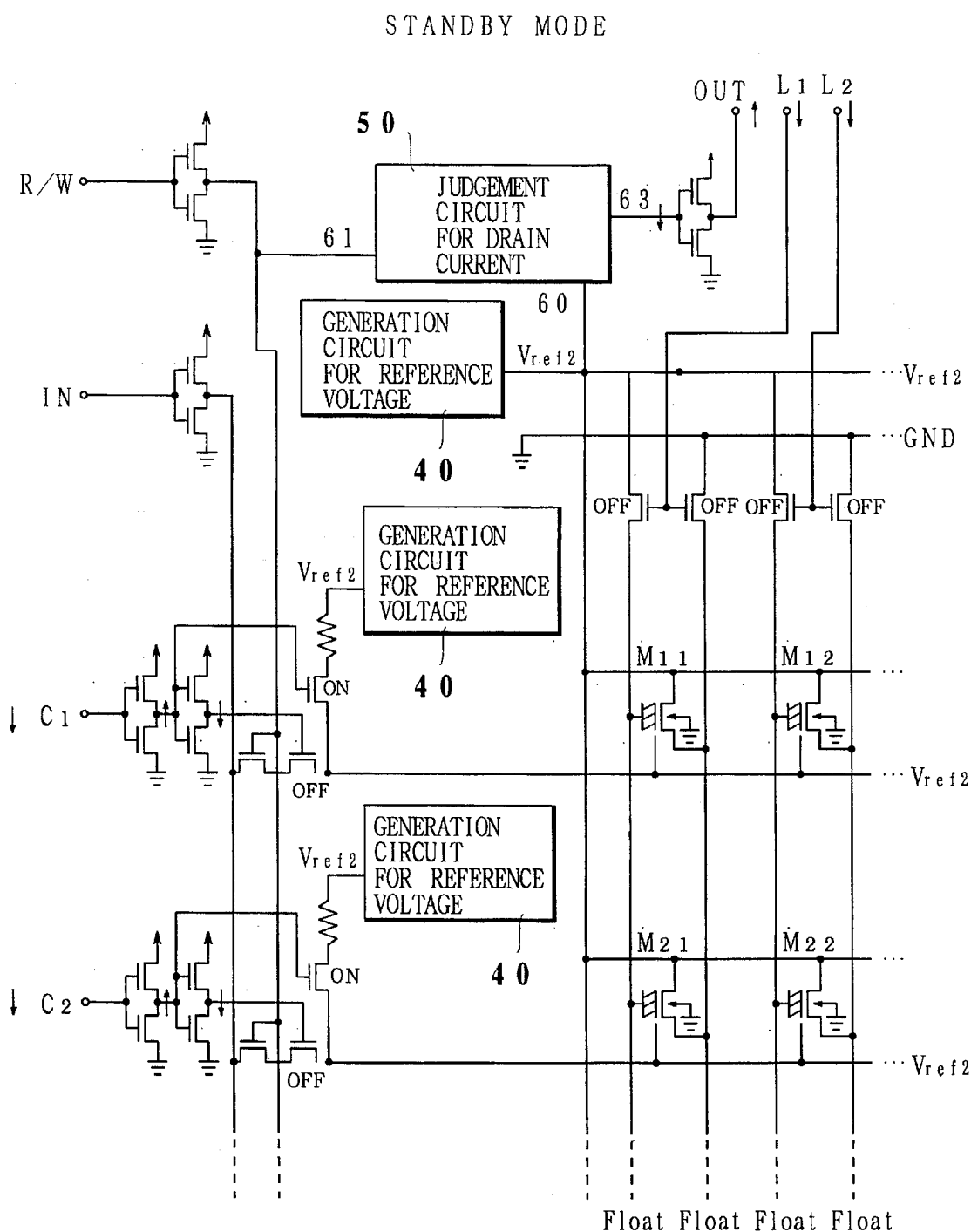
FIG. 13 shows applied voltage to the nonvolatile memory in the standby mode of the embodiment of the present invention.

Applied voltage to each terminal in standby mode is shown in FIG. 14. Standby mode will be described below referring to FIG. 13. In standby mode, all terminals $C_1$, $C_2$ . . . , $L_1$, $L_2$ . . . are "L" (that is no address selection). In all memory devices $M_{11}$, $M_{12}$ . . . , $M_{21}$, $M_{22}$ . . . , the memory gate is applied with the reference voltage and the control gate is of floating status. Therefore, it can be prevented from changing the recorded information, i.e. polarization direction.

Figure 15:
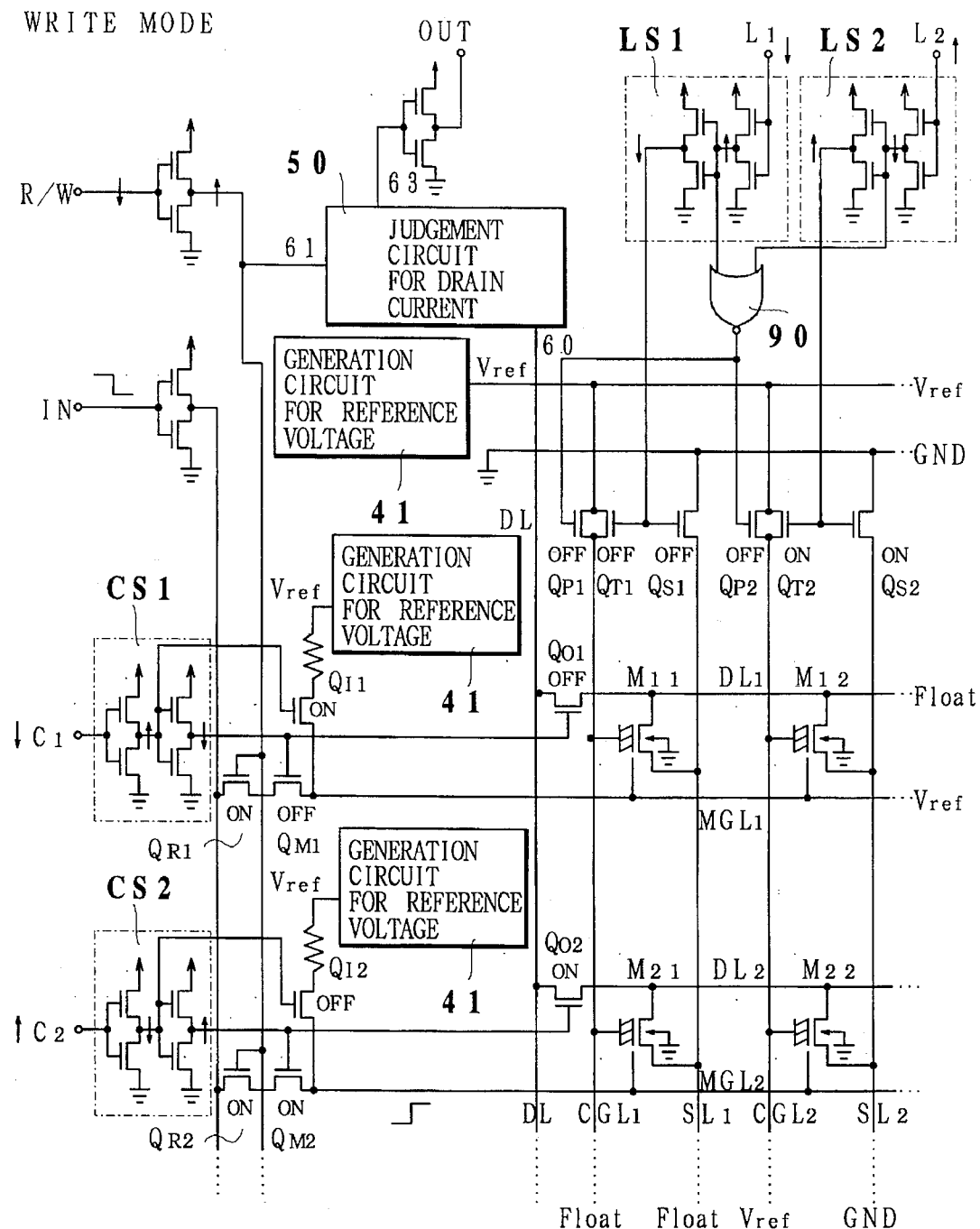
FIG. 15 shows applied voltage in the write mode of a nonvolatile memory having drain switching means.
Figure 16:
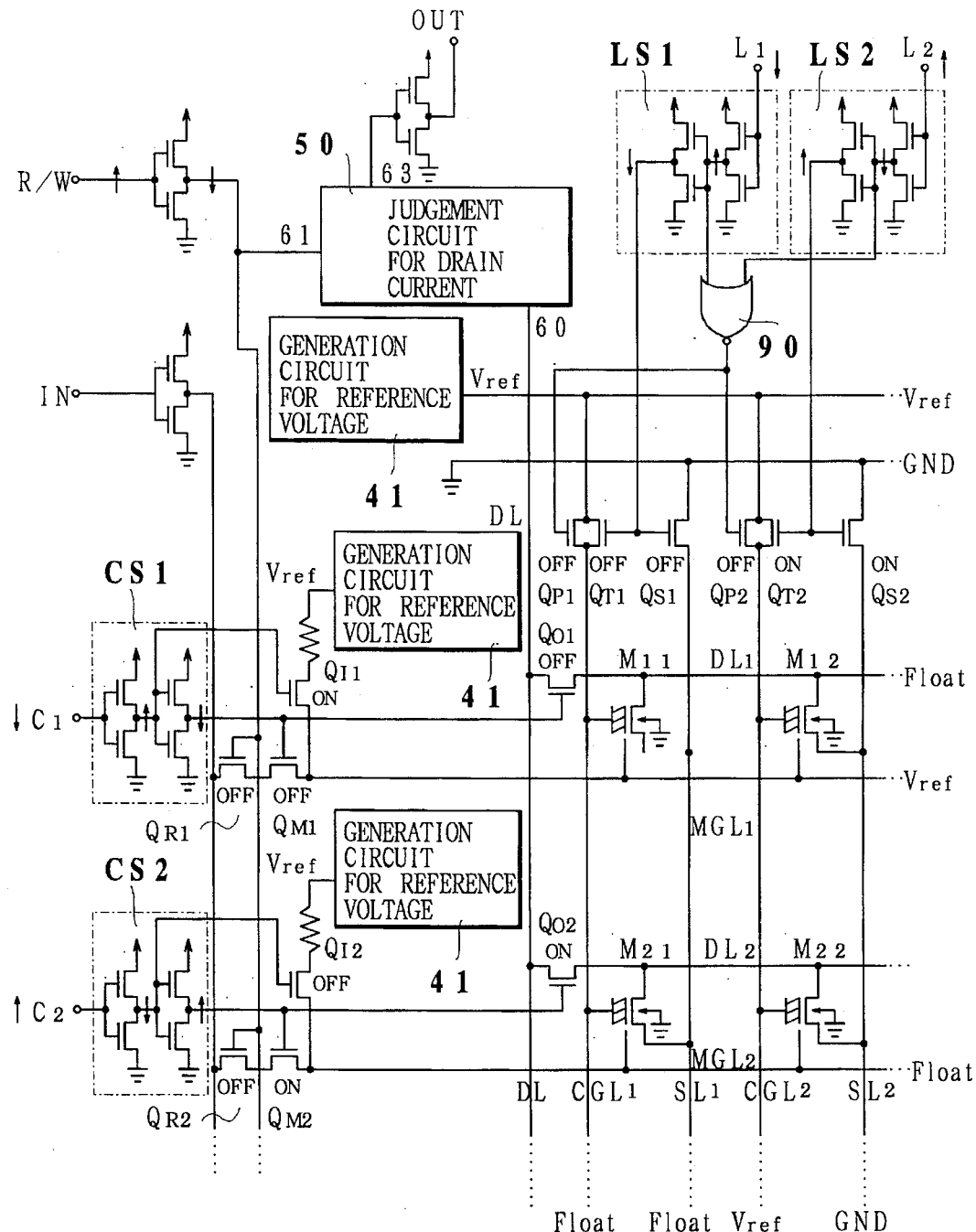
FIG. 16 shows applied voltage in the read mode of a nonvolatile memory having drain switching means.
Figure 17:
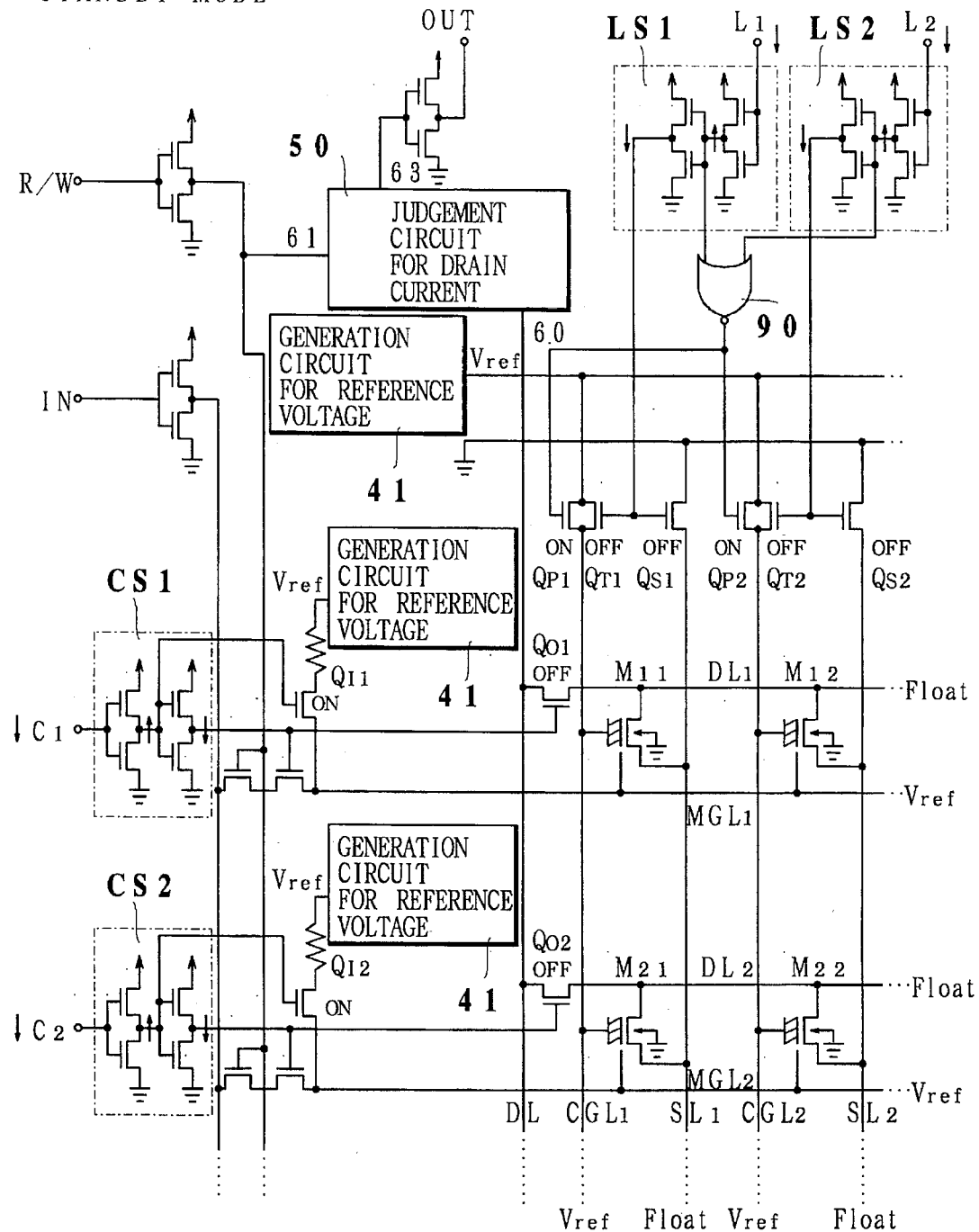
FIG. 17 shows applied voltage in the standby mode of a nonvolatile memory having drain switching means.

The nonvolatile memory matrix circuit of another embodiment of the present invention will be described referring to FIGS. 15 to 17. FIG. 15 shows the write operation, FIG. 16 shows the read operation and FIG. 17 shows standby status.

In this embodiment, drain switching means $Q_{o1}$, $Q_{o2}$ . . . are provided into the drain lines $DL_1$, $DL_2$ . . . , respectively. Only the drain switching means $Q_{o2}$ in the selected line $DL_2$ turns on by control of the first selecting means $CS_1$, $CS_2$ . . . . Therefore, in the read operation mode (see FIG. 16), the unified drain line DL is connected only to the selected drain line $DL_2$ having the selected memory device $M_{22}$. By providing the drain switching means $Q_{o1}$, $Q_{o2}$ . . . , an erroneous read operation can be prevented even when the reference voltage $V_{ref}$ as shown in FIG. 5 is used. Therefore, the operating point including the reference voltage can be established in an easy manner.

In this embodiment, second selecting means $LS_1$, $LS_2$ . . . are provided for columns, respectively. The source switching means $Q_{s1}$, $Q_{s2}$ . . . are controlled by the second selecting means $LS_1$, $LS_2$ . . . , respectively. Control gate switching means is constituted by transistors $Q_{T1}$, $Q_{T2}$ . . . , transistors $Q_{P1}$, $Q_{P2}$ . . . and NOR gate 90. In the standby mode as shown in FIG. 17, all the transistors $Q_{P1}$, $Q_{P2}$ . . . turn on by "H" output of the NOR gate 90 because all the terminals $L_1$, $L_2$ . . . are "L". Therefore, the reference voltage $V_{ref}$ is impressed to all of the control gate lines $CGL_1$, $CGL_2$ . . . . The reference voltage $V_{ref}$ is also impressed to all of the memory gate lines $MGL_1$, $MGL_2$ . . . Therefore, there is no voltage difference between both sides of the ferroelectric layer of each of the memory devices $M_{11}$, $M_{12}$ . . . , $M_{21}$, $M_{22}$ . . . . Therefore, recorded information (direction of polarization) of the memory device is not changed in the standby mode.

Figure 18:
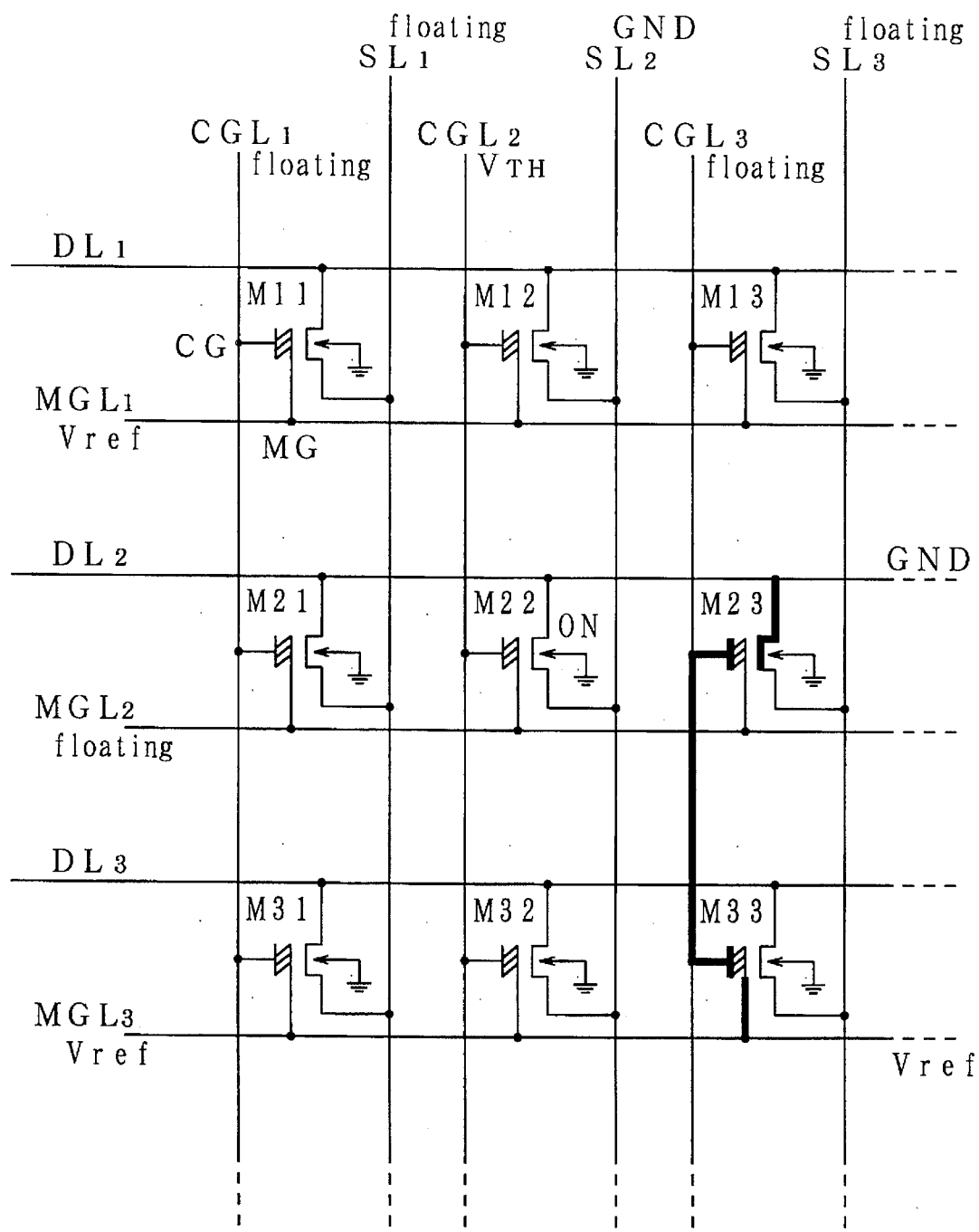
FIGS. 18 and 19 show the voltage applied path in the read operation mode.

There is a possibility of erroneous operation in the memory matrix circuit shown in FIGS. 11 to 13 or FIGS. 15 to 17, due to established reference voltage, characteristic of ferroelectric layer of memory device or other factor. FIG. 18 shows the read operation of the memory matrix circuit shown in FIGS. 15 to 17. As described before, in the case of reading from the selected memory device $M_{22}$, only the control gate line $CGL_2$ is applied with the reference voltage $V_{ref}$ and the other control gate lines $CGL_1$, $CGL_3$ . . . are of floating status. Only the source line $SL_2$ is connected to ground and the other source lines $SL_1$, $SL_3$ . . . are of floating status. Further, only the memory gate line $MGL_2$ is of floating status and other memory gate lines MGL1, MGL3 . . . are applied with the reference voltage $V_{ref}$.

In such condition, the drain line $DL_2$ is connected to ground when the selected memory device $M_{22}$ is polarized in the second state that makes channel. Drain of neighboring memory device $M_{23}$ is also connected to ground. On the other hand, memory gate of memory device $M_{33}$ is applied with the reference voltage $V_{ref}$. Further, the control gate line $CGL_3$ connected to the memory devices $M_{23}$ and $M_{33}$ is of floating status. Therefore, the reference voltage $V_{ref}$ is applied to the memory gate of memory device $M_{33}$ and the ground is connected to the source of memory device $M_{23}$, as shown in solid line in FIG. 18. There are, therefore, some cases where the ferroelectric layers of the devices M23 and M33 are unexpectedly polarized by the voltage difference between the reference voltage and the ground voltage, in accordance with characteristics of the ferro-dielectric layer.

Figure 19:
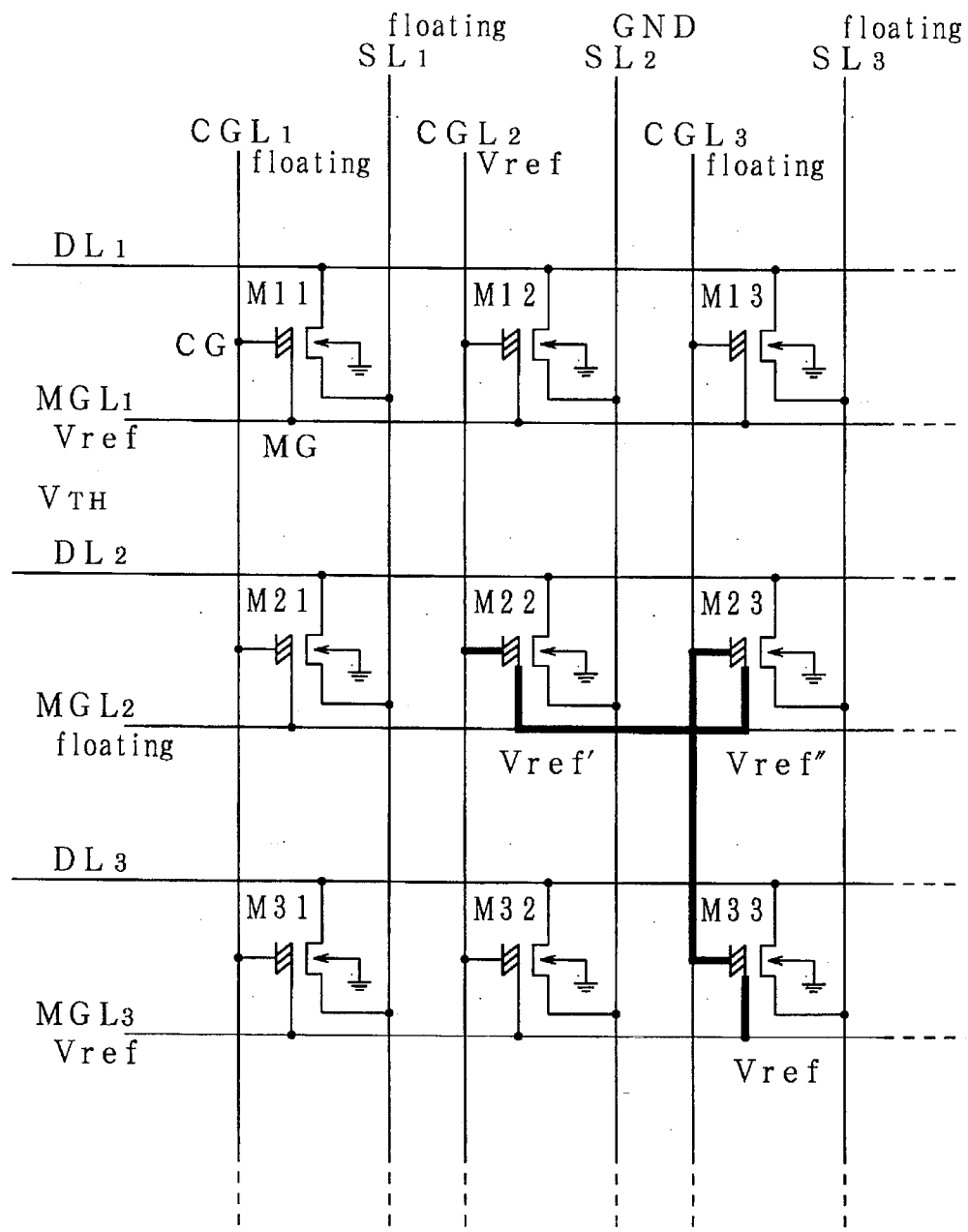

Further, there is a possibility of erroneous operation in the memory matrix circuit shown in FIGS. 11 to 13 or FIGS. 15 to 17, due to established reference voltage, characteristic of ferroelectric layer of memory device or other factor. FIG. 19 shows read operation of the memory matrix circuit shown in FIGS. 15 to 17. The reference voltage $V_{ref}$ is applied to the memory gate of selected memory device $M_{22}$. There is the possibility that higher voltage $V_{ref'}$ than the reference voltage $V_{ref}$ is generated on the memory gate. This voltage $V_{ref'}$ is impressed to neighboring memory device $M_{23}$. There is the possibility that higher voltage $V_{ref''}$ than the voltage $V_{ref'}$ is generated on the memory gate. This voltage $V_{ref''}$ is impressed to the control gate of memory device $M_{33}$. To the memory gate of memory device $M_{33}$ the reference voltage $V_{ref}$ is applied. Difference voltage between the $V_{ref}$ and the $V_{ref''}$ is applied to the ferroelectric layer of the memory device $M_{33}$. There are, therefore, some cases where the ferroelectric layer of the device M33 is unexpectedly polarized by this difference voltage, in accordance with characteristics of the ferroelectric layer.

In the write operation, there is the same possibility as in the read operation described above.

FIGS. 20 to 25 shows a memory matrix circuit to prevent such possible problems. In this embodiment, each of protection transistors $H_{11}$, $H_{12}$ . . . , $H_{21}$, $H_{22}$ . . . is provided as control gate protection means to each control gate of the memory devices, respectively. The memory devices in the same column are connected to the control gate line through the protection transistor. The protection transistors $H_{11}$, $H_{21}$ . . . turn on when the selecting terminal $L_1$ is "H" and the protection transistors $H_{12}$, $H_{22}$ . . . turn on when the selecting terminal $L_2$ is "H". In other words, the protection transistors in columns where the selected memory devices do not exist, turn off.

Figure 20:
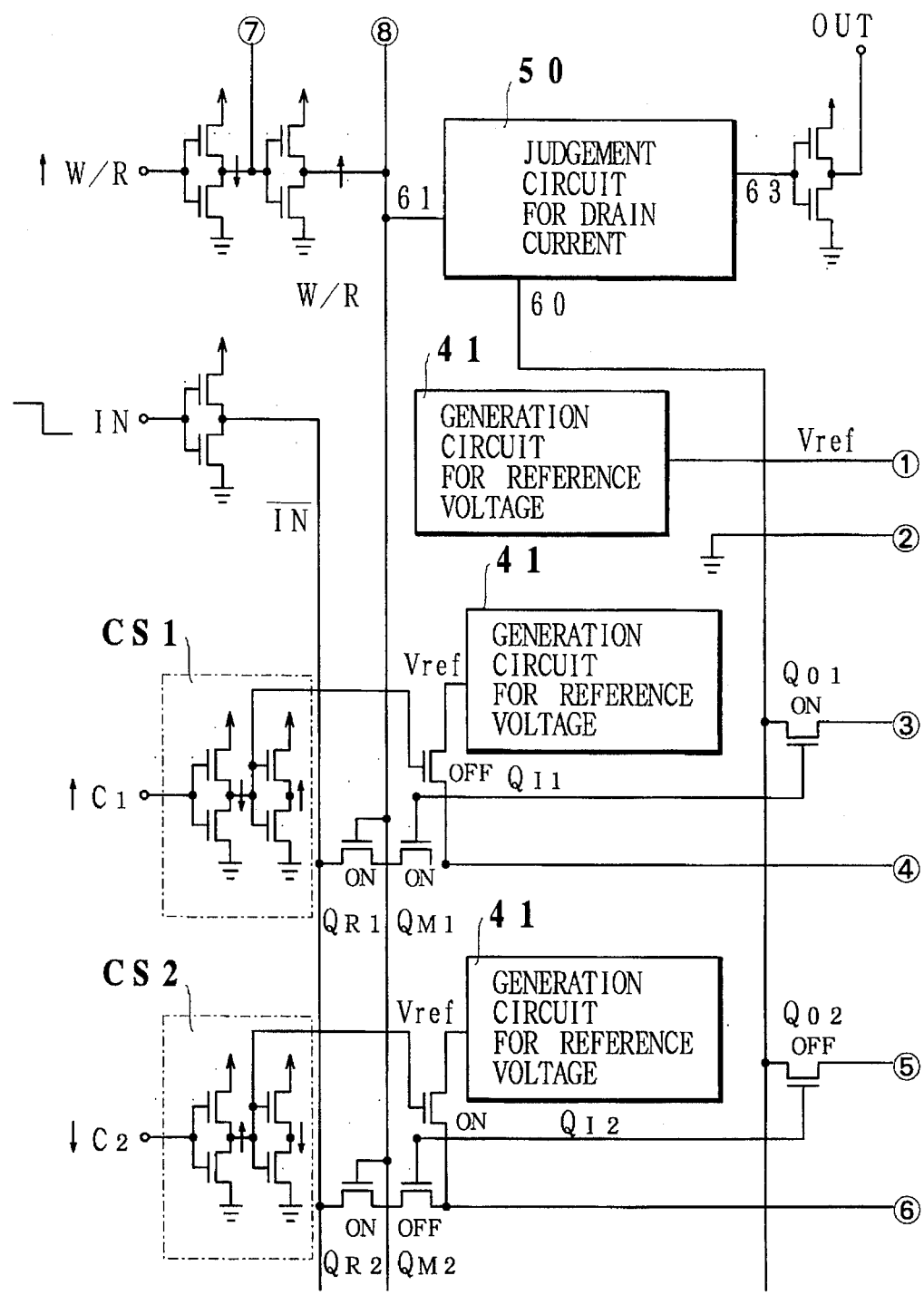
FIGS. 20 and 21 show applied voltage in the write mode of a nonvolatile memory having protection switching means for the control gate.
Figure 21:
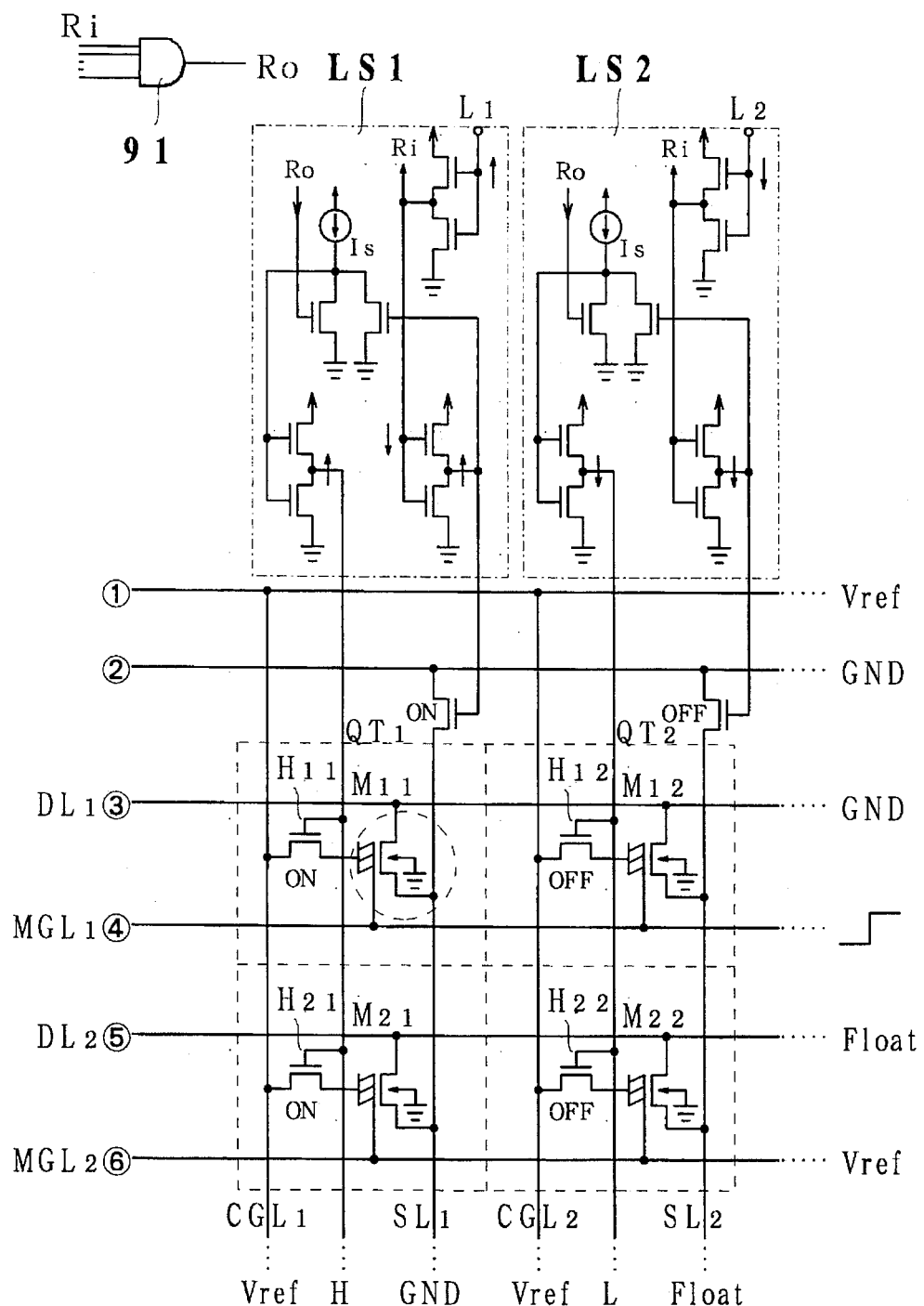

FIGS. 20 and 21 show the write operation status. In the following description, it is provided that the memory device $M_{11}$ is the selected memory. In this case, "H" is applied to the terminal $C_1$, "L" is applied to the terminal $C_2$ . . . , "H" is applied to the terminal $L_1$, "L" is applied to the terminal $L_2$ . . . . The protection transistors $H_{11}$, $H_{21}$ . . . turn on and write voltage is applied to the selected memory device $M_{11}$. On the other hand, because the protection transistors $H_{12}$, $H_{22}$ . . . are OFF, the control gates of memory devices $M_{12}$, $M_{22}$ . . . are disconnected from the control gate line $CGL_2$ . . . . Therefore, the voltage path shown by solid lines in FIGS. 18 and 19 is not formed and erroneous writing or erroneous erasing is prevented.

Figure 22:
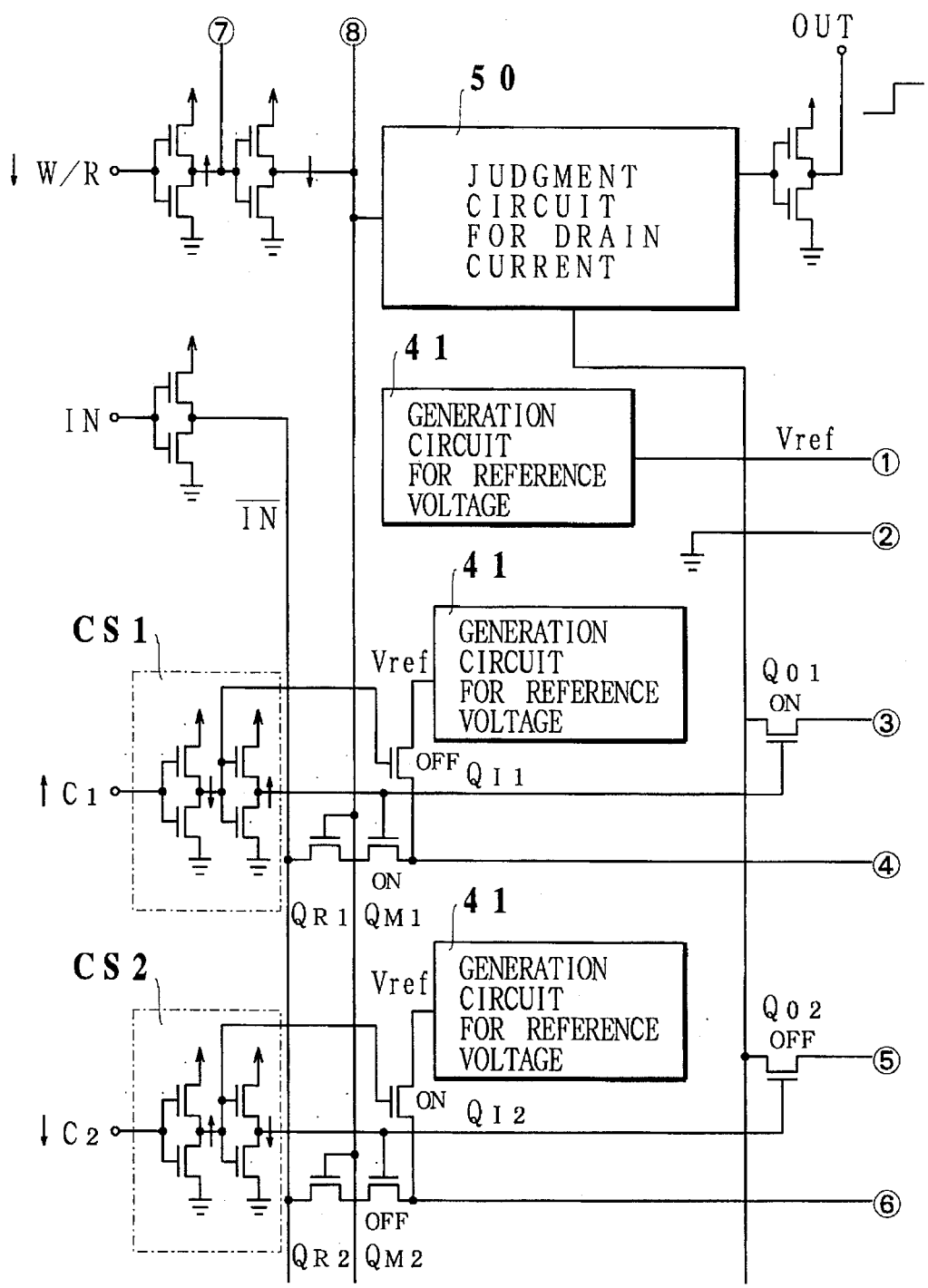
FIGS. 22 and 23 show applied voltage in the read mode of a nonvolatile memory having protection switching means for the control gate.
Figure 23:
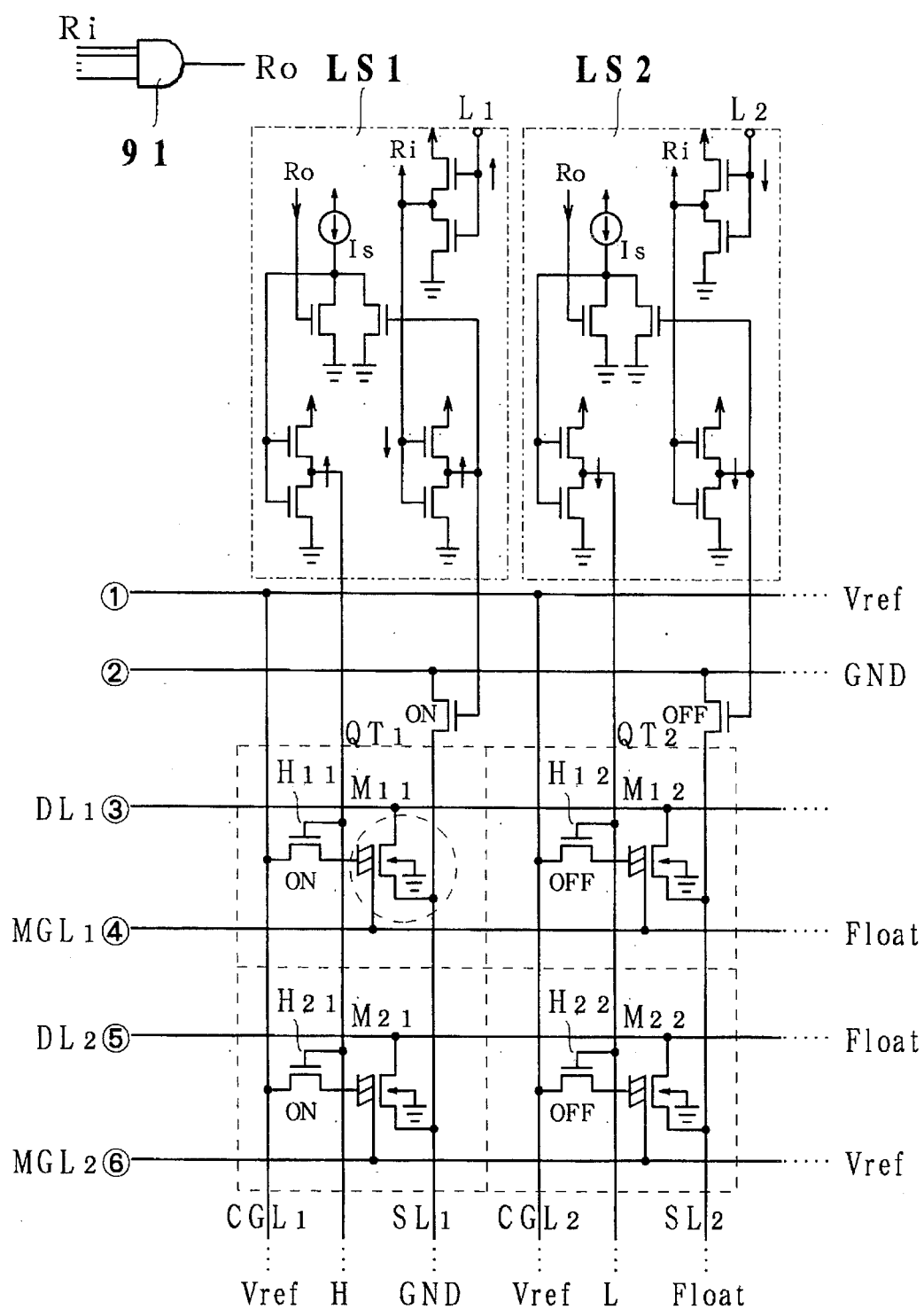

FIGS. 22 and 23 show the read operation status. Also in the read operation, the protection transistors $H_{12}$, $H_{22}$ . . . in columns where the selected memory device $M_{11}$ is not present, turn off. Therefore, the voltage path shown by solid lines in FIGS. 18 and 19 is not formed and erroneous writing or erroneous erasing is prevented.

Figure 24:
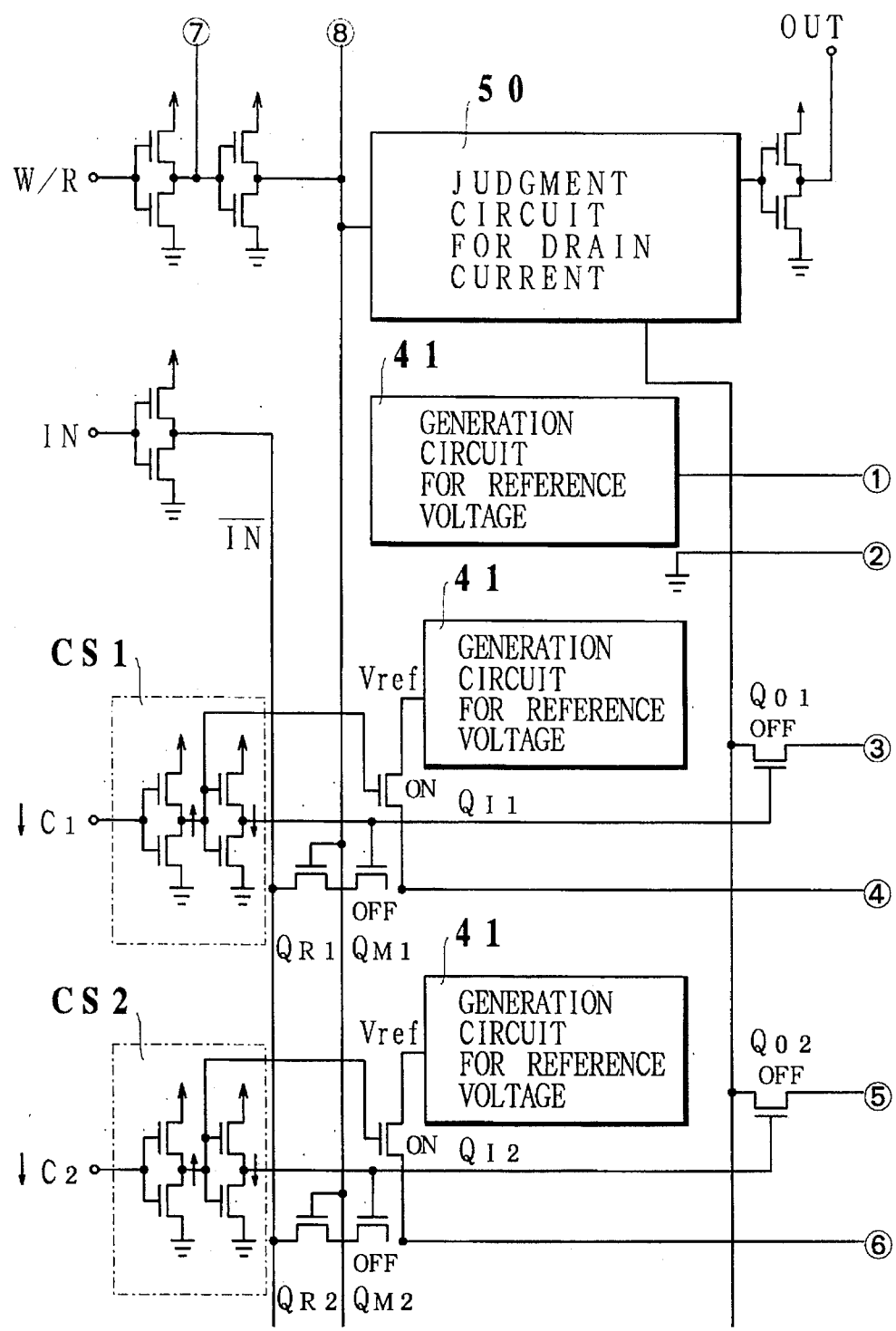
FIGS. 24 and 25 show applied voltage in the standby mode of a nonvolatile memory having protection switching means for the control gate.
Figure 25:
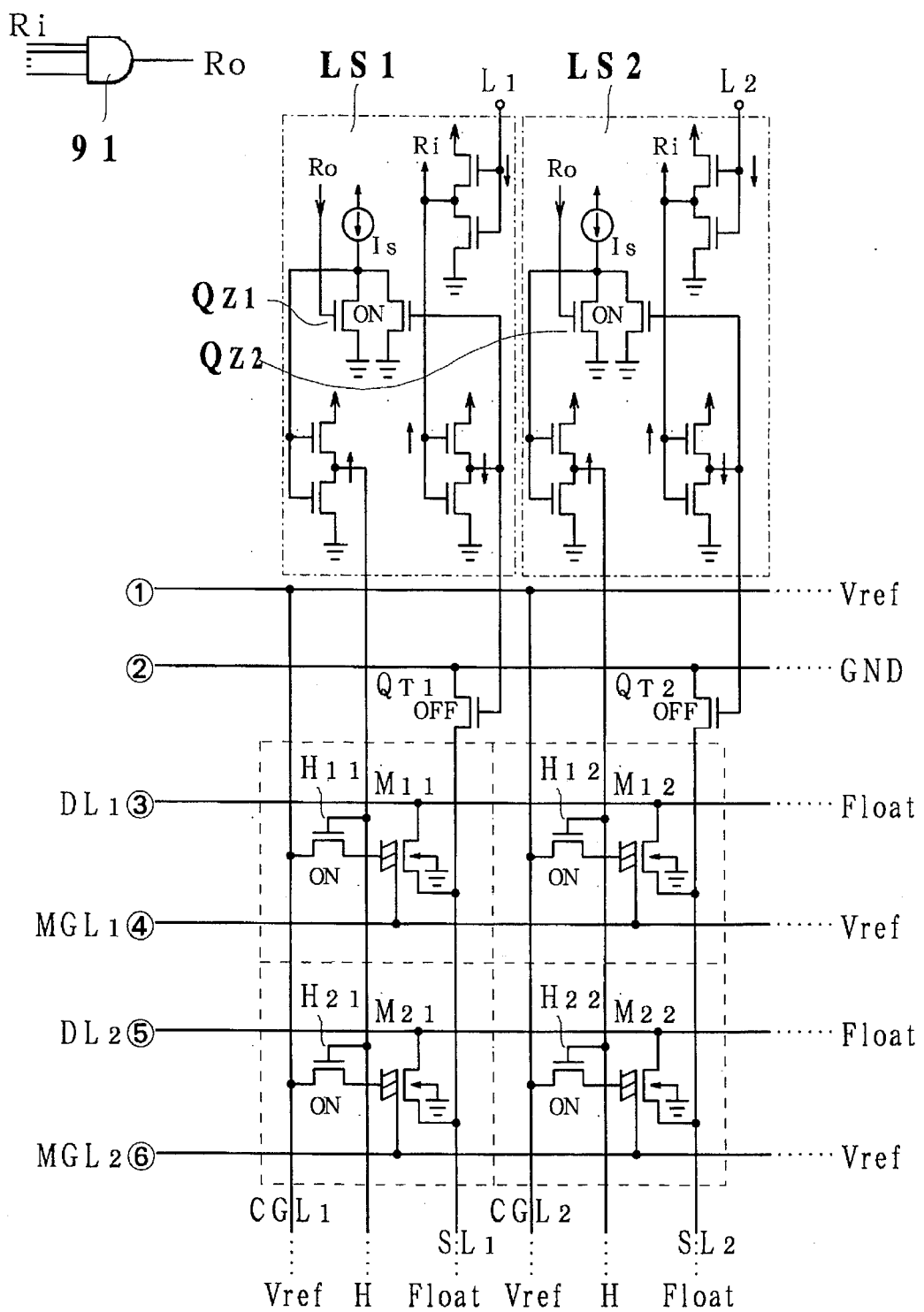

FIGS. 24 and 25 show the standby status. In the standby mode, "L" is applied to all of the terminals $C_1$, $C_2$ . . . , $L_1$, $L_2$ . . . . Inverted output Ri of the terminals $C_1$, $C_2$ . . . are given to AND circuit 91 as a standby detection means. An output Ro of AND circuit 91 therefore becomes "H". By this "H" output, transistors $Q_{Z1}$, $Q_{Z2}$ . . . turn on and all of the protection transistors $H_{11}$, $H_{12}$ . . . , $H_{21}$, $H_{22}$ . . . turn on. No voltage difference exists between both sides of the ferroelectric layer of each memory device, because the reference voltage $V_{ref}$ is applied to both sides of the ferroelectric layer. Therefore, change of the written information in the memory devices in the standby mode is prevented, as described above.

FIGS. 26 to 31 show a memory matrix circuit of another embodiment to prevent the possible problems shown in FIGS. 18 and 19. In this embodiment, each of protection transistors $H_{11}$, $H_{12}$ . . . , $H_{21}$, $H_{22}$ . . . is provided as memory gate protection means to each memory gate of the memory devices, respectively. The memory devices in the same line are connected to the memory gate line through the protection transistor. The protection transistors $H_{11}$, $H_{21}$ . . . turn on when the selecting terminal $L_1$ is "H" and the protection transistors $H_{12}$, $H_{22}$ . . . turn on when the selecting terminal $L_2$ is "H". In other words, the protection transistors in columns where the selected memory devices do not exist, turn off. In this embodiment, memory gate switching means is constituted by transistors $Q_{R1}$, $Q_{M1}$ ($Q_{R2}$, $Q_{M2}$).

Figure 26:
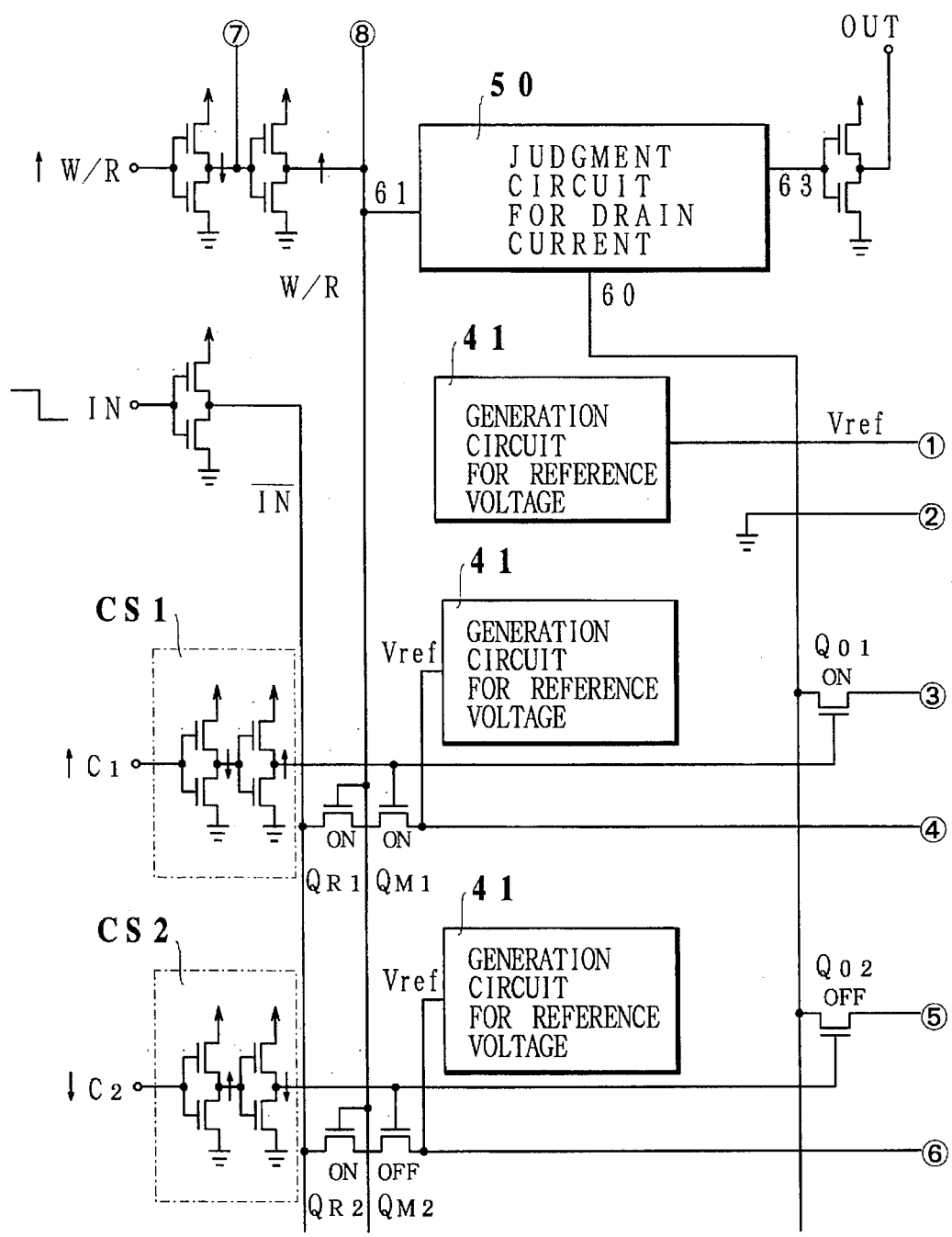
FIGS. 26 and 27 show applied voltage in the write mode of a nonvolatile memory having protection switching means for the memory gate.
Figure 27:
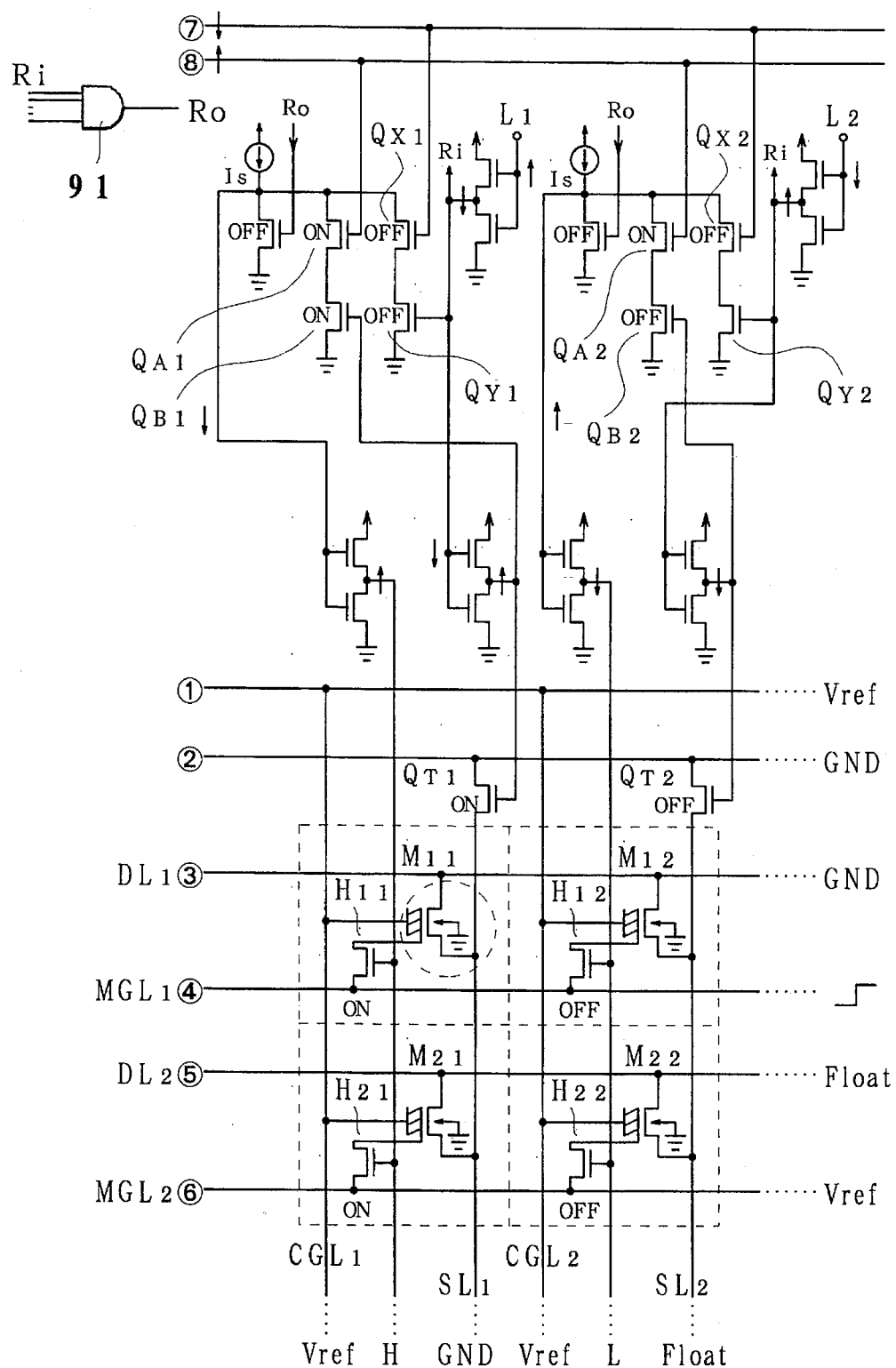

FIGS. 26 and 27 show the write operation status. In the following description, it is provided that the memory device $M_{11}$ is the selected memory. In this case, "H" is applied to the terminal $C_1$, "L" is applied to the terminal $C_2$ . . . , "H" is applied to the terminal $L_1$ and "L" is applied to the terminal $L_2$ .... In the write operation mode, "H" voltage is impressed to the transistors $Q_{A1}$, $Q_{A2}$ and thereby the transistors $Q_{A1}$, $Q_{A2}$ ... turn on (see). "L" voltage is impressed the transistors $Q_{X1}$, $Q_{X2}$ and thereby the transistors $Q_{X1}$, $Q_2$ ... turn off (see). Therefore, whether protection transistors in a column turn on or off, depends on the status (ON or OFF) of transistor $Q_{B1}$ or $Q_{B2}$ ...

In this case, transistor $Q_{B1}$ turns on, so the protection transistors $H_{11}$, $H_{21}$ ... in the column where the selected memory device exists turn on. Therefore, write voltage is applied to the selected memory device $M_{11}$.

On the other hand, because the protection transistors $H_{12}$, $H_{22}$ ... are OFF caused by the transistor $Q_{B2}$ being OFF, the memory gates of memory devices $M_{12}$, $M_{22}$ ... are disconnected from the memory gate line $MGL_2$ ... Therefore, the voltage path shown by solid line in FIGS. 18 and 19 is not formed and erroneous writing or erroneous erasing is prevented.

Figure 28:
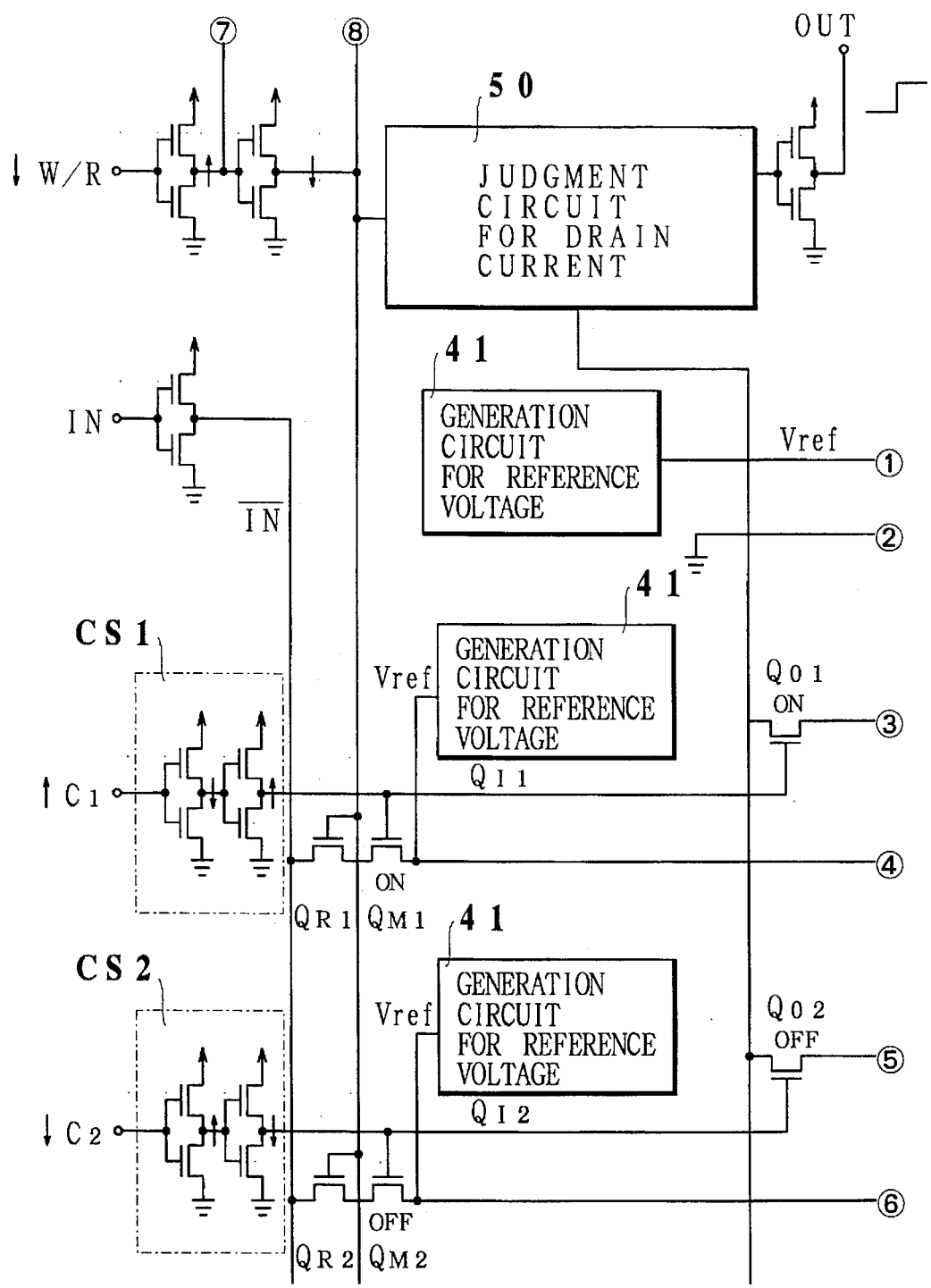
FIGS. 28 and 29 show applied voltage in the read mode of a nonvolatile memory having protection switching means for the memory gate.
Figure 29:
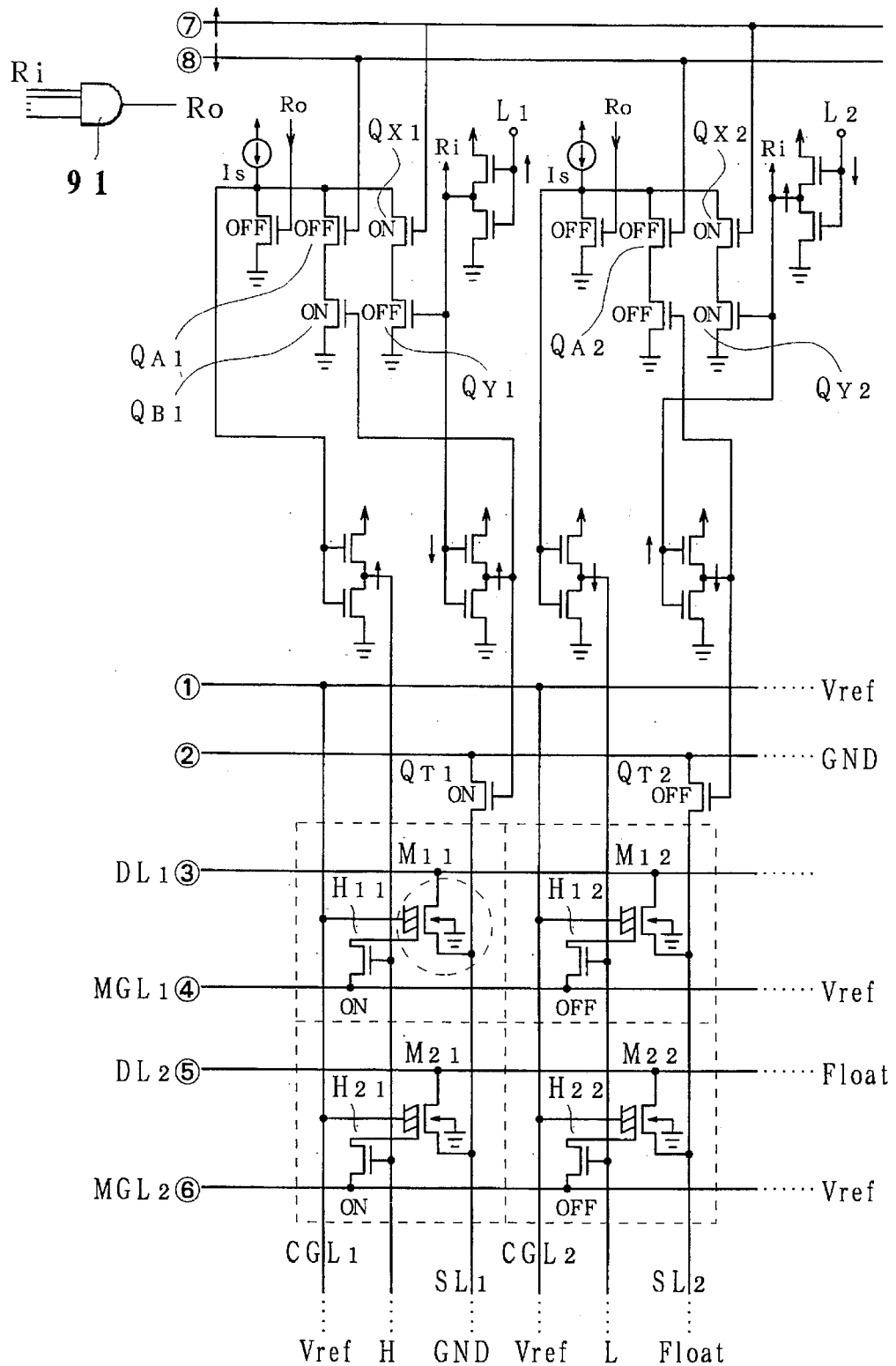

FIGS. 28 and 29 show the read operation status. Also in the read operation, "H" is applied to the terminal $C_1$, "L" is applied to the terminal $C_2$ ..., "H" is applied to the terminal $L_1$ and "L" is applied to the terminal $L_2$ ... In the read operation mode, "L" voltage is impressed to the transistors $Q_{A1}$ $Q_{A2}$ and thereby the transistors $Q_{A1}$ $Q_{A2}$ ... turn off (see). "H" voltage is impressed to the transistors $Q_{X1}$, $Q_{X2}$ and thereby the transistors $Q_{X1}$, $Q_{X2}$ ... turn on (see). Therefore, whether protection transistors in a column turn on or off, depends on the status (ON or OFF) of transistor $Q_{Y1}$ or $Q_{Y2}$ ...

In this case, because the transistor $Q_{Y1}$ is OFF, the protection transistors $H_{11}$, $H_{21}$ ... in the column where the selected memory device exists turn off. Therefore, the memory gates of memory devices $M_{12}$ ... in the line where the selected memory device $M_{11}$ exists, are disconnected from the memory gate lines $MGL_1$, $MGL_2$ ... Therefore, the recorded voltage can be read from the selected memory device $M_{11}$. Further, the voltage path shown by solid lines in FIGS. 18 and 19 is not formed and erroneous writing or erroneous erasing is prevented.

On the other hand, because the protection transistors $H_{12}$, $H_{22}$ ... are ON caused by the transistor $Q_{Y2}$ being ON, the memory gates of memory devices $M_{12}$, $M_{22}$ ... are applied with the reference voltage $V_{ref}$. Therefore, change to the written information in the memory devices $M_{12}$, $M_{22}$ is prevented.

In the embodiment shown in FIG. 23, because the control gates of memory devices in unselected columns become of floating status by the OFF state of the protection transistors $H_{12}$, $H_{22}$ ..., unexpected voltage is not impressed to the ferroelectric layer. However, unselected memory device $H_{12}$ in the selected line is connected to the selected memory device $M_{11}$ through the memory gate line $MGL_1$ that is of floating state, so that unexpected voltage is impressed to a memory gate side of the ferroelectric layer of the device $M_{12}$. Therefore, there is the possibility that the recorded information is changed, in accordance with the floating capacitance or wiring capacitance. On the other hand, in the embodiment shown in FIGS. 26 to 31, because the memory gate is disconnected from the memory gate line by the protection transistors $H_{11}$, $H_{21}$ ..., there is no such problem.

Figure 30:
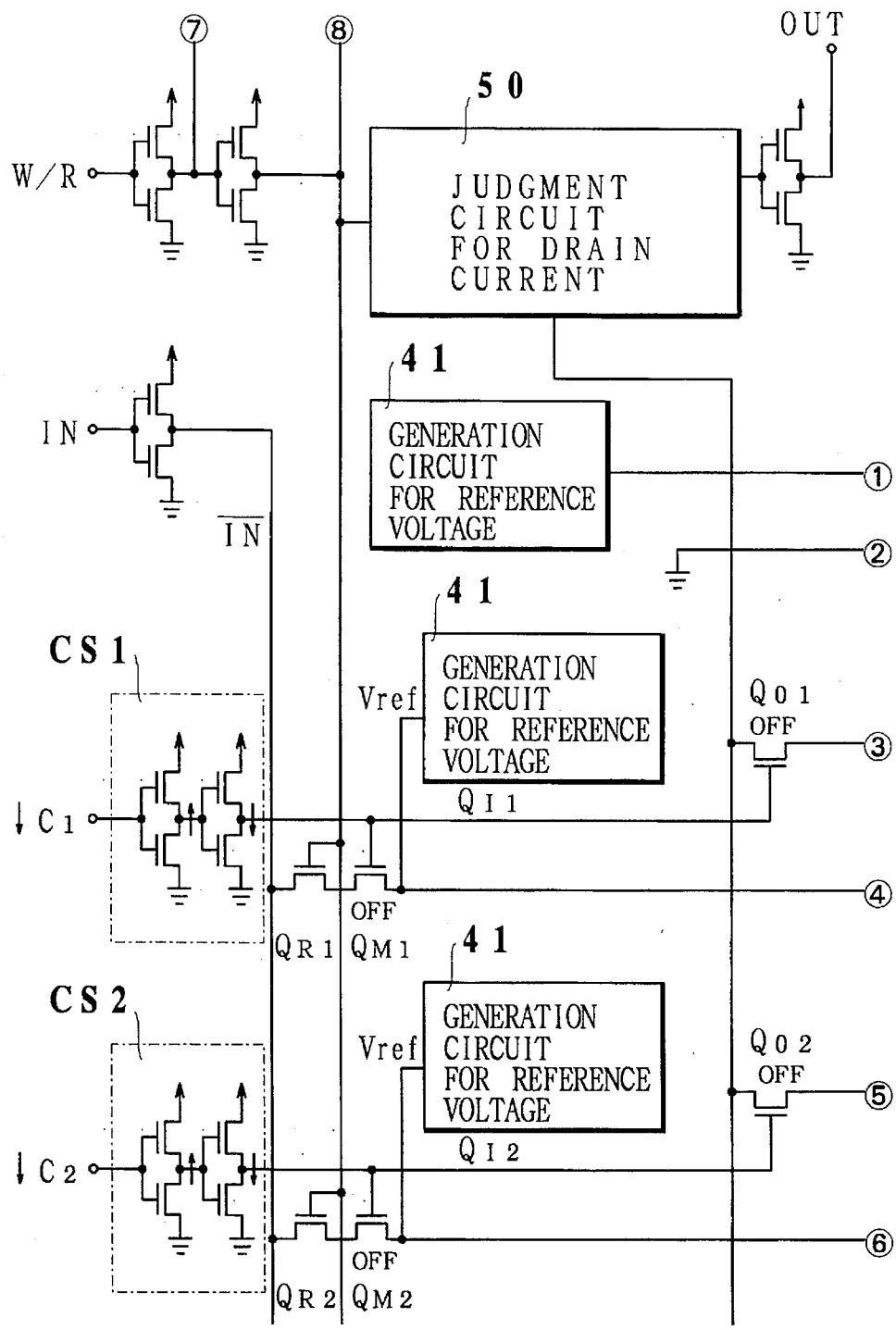
FIGS. 30 and 31 show applied voltage in the standby mode of a nonvolatile memory having protection switching means for the memory gate.
Figure 31:
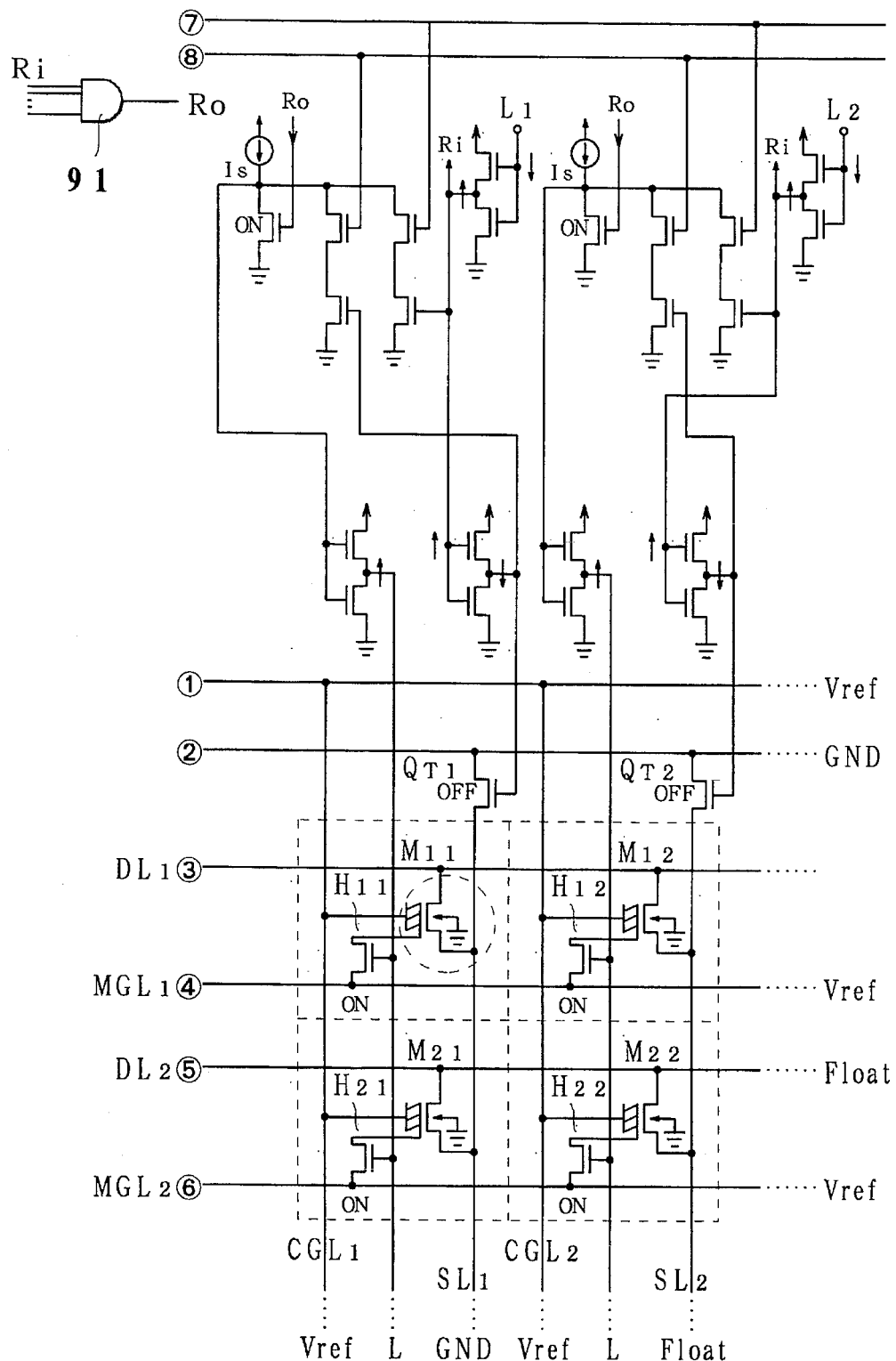

FIGS. 30 and 31 show standby status. In the standby mode, "L" is applied to all of the terminals $C_1$, $C_2$ ..., $L_1$, $L_2$ .... Inverted output Ri of the terminals $C_1$, $C_2$ ... are given to AND circuit 91 as a standby detection means. An output Ro of AND circuit 91 therefore becomes "H". By this "H" output, transistors $Q_{T1}$, $Q_{T2}$ ... turn on and all of the protection transistors $H_{11}$, $H_{12}$ ..., $H_{21}$, $H_{22}$—turn on. No voltage difference exists between both sides of the ferroelectric layer of each memory device, because the reference voltage $V_{ref}$ is applied to both sides of the ferroelectric layer. Change to the written information in the memory devices in the standby mode is prevented, as described above.

In another embodiment, both the control gate protection switching means shown in FIG. 21 and the memory gate protection switching means shown in FIG. 27 may be provided.

In above mentioned embodiments, the source switching means (transistor $Q_{T1}$, $Q_{T2}$ ... ) switch whether the source lines $SL_1$, $SL_2$ ... are connected to ground or are of floating status. In another embodiment, the source switching means (transistor $Q_{T1}$, $Q_{T2}$ ... ) may switch whether the source lines $SL_1$, $SL_2$ ... are connected to the reference voltage $V_{ref}$ or are of floating status.

Figure 32:
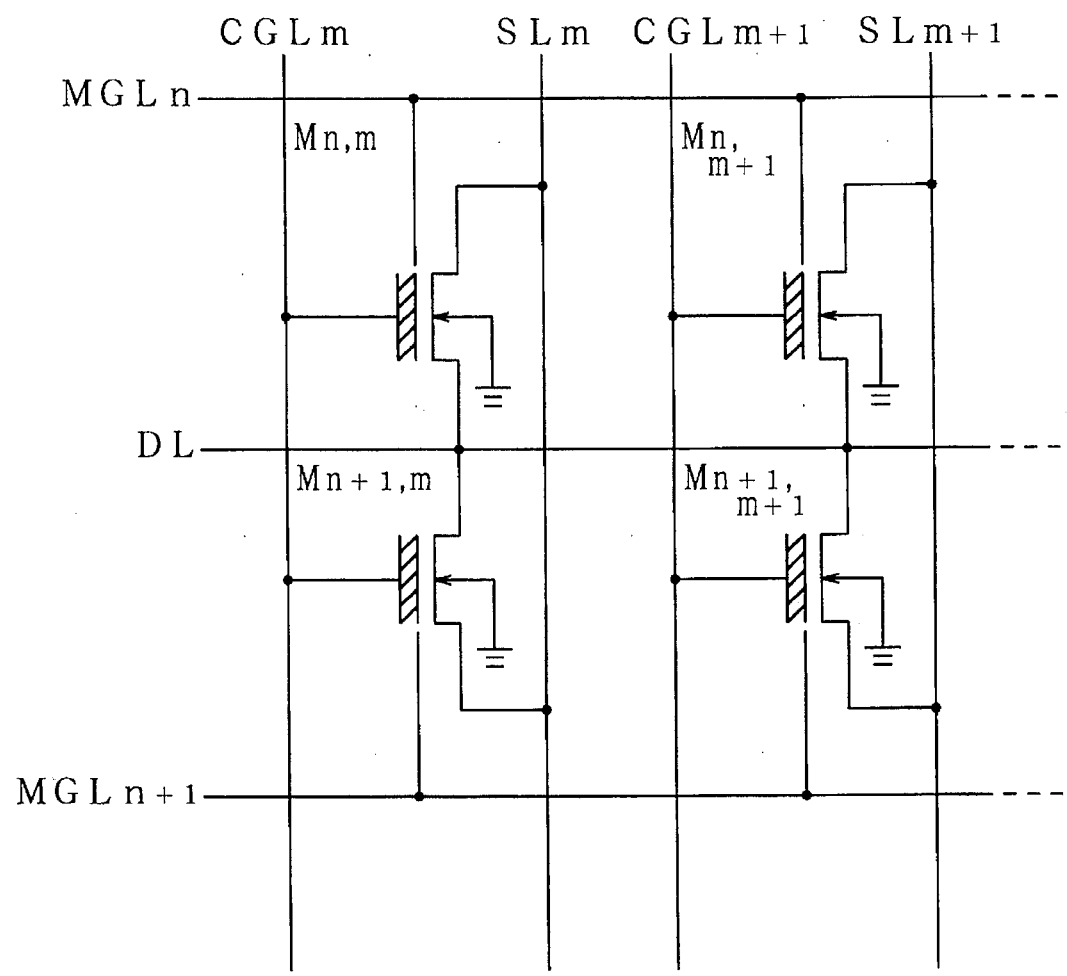
FIG. 32 shows another matrix structure of a memory.

Concerning the above-mentioned embodiments, memory matrix may be constituted by a pair cell structure shown in FIG. 32.

In the nonvolatile memory of the present invention, the control gate and the memory gate are provided at opposite sides of the ferroelectric layer. Further, the control gates of devices in the same column are connected to the control gate line, and the memory gates of devices in the same line are connected to the memory gate line. Therefore, write or read operation to the desired device can be carried out by selectively applying the control gate and the memory gate.

In the nonvolatile memory of the present invention, the drain lines connecting to the drains of devices in the same line, are connected to the unified drain line connecting to the judgment circuit for drain current through the drain switching means. The read operation can be carried out without error because undesirable drain currents from unselected drain lines are not given to the unified drain line.

In the nonvolatile memory of the present invention, drain switching means is provided for each drain line, memory gate switching means is provided for each memory gate line, source switching means is provided for each source line and control gate switching means is provided for each control gate line. Therefore, the write or read operation to the desired device can be carried out by selecting the device by controlling the switching device.

In the nonvolatile memory of the present invention, first selecting means is provided for each line and second selecting means is provided for each column. Therefore, the write or read operation to the desired device can be carried out by selecting the device by selectively applying the selected input to first and second selecting means.

In the nonvolatile memory of the present invention, all the control gate switching means turn on and the reference voltage is applied to all the control gates when no selecting input is applied to any column. Therefore, unexpected voltage is not applied to both sides of the ferroelectric layer, and recorded information does not change, when read operation or write operation is not carried out.

In the nonvolatile memory of the present invention, the control gates of devices in the same column are connected to the control gate line through the control gate protection switching means. Undesirable voltage is not impressed to the unselected devices by turning off the control gate protection switching means in the unselected columns. Therefore, erroneous writing or reading to unselected devices is prevented.

In the nonvolatile memory of the present invention, the memory gates of devices in the same line are connected to the memory gate line through the memory gate protection switching means. Undesirable voltage is not impressed to the unselected devices by turning off the memory gate protection switching means in the unselected lines. Therefore, erroneous writing or reading to unselected devices is prevented. Further, the writing voltage is not impressed even to one side of ferroelectric layers of unselected devices, so that erroneous writing or erasing is prevented.

In the writing method of the present invention, only to the selected device, writing voltage ("H" or "L") is impressed to the memory gate and the reference voltage is impressed to the control gate. Therefore, only to the selected device can the writing operation be carried out without undesirable effect on unselected devices.

In the reading method of the present invention, only to selected device, the control gate is impressed with the reference voltage and the memory gate is floating. Therefore, only to the selected device can the writing operation be carried out without undesirable effect on unselected devices.

In the standby method of the present invention, the reference voltage is impressed to all memory gate lines and control gate lines. Therefore, recorded information is not changed in the standby mode.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. Nonvolatile memory formed by nonvolatile memory devices connected in a matrix of columns and lines:

wherein each of said nonvolatile memory devices comprises, a source region and a drain region, a channel region formed between the source and the drain regions, a memory gate formed on the channel region and insulated from the channel region, a ferroelectric layer formed on the memory gate, and a control gate formed on the ferroelectric layer, and wherein said nonvolatile memory comprises, a first drain line which connects the drain regions of the nonvolatile memory devices in the same line of the matrix;

a unified second drain line which connects at least some of the first drain lines of the matrix, a memory gate line which connects the memory gates of the nonvolatile memory devices in the same line of the matrix, a source line which connects the source regions of the nonvolatile memory devices in the same column of the matrix, and a control gate line which connects the control gates of the nonvolatile memory devices in the same column of the matrix.

2. Nonvolatile memory in accordance with claim 1 further comprising, drain switching means for each of said first drain lines, each of said drain switching means for switching depending on whether the corresponding first drain line is connected or not connected to current judgment means for draining current through the unified second drain line, and wherein one of said drain switching means connected to a selected one of said nonvolatile memory devices turns on and others of said drain switching means turn off.

3. Nonvolatile memory in accordance with claim 1 further comprising, drain switching means for each of said first drain lines, each of said drain switching means for switching depending on whether the corresponding first drain line is connected or not connected to current judgment means for draining current through the unified second drain line, memory gate switching means for each of said memory gate lines, each of said memory gate switching means for switching depending on whether a writing voltage of H level or L level is impressed or not impressed to the corresponding memory gate line, source switching means for each of said source lines, each of said source switching means for switching depending on whether the source line is connected or not connected to ground level, and control gate switching means for each of said control gate lines, each of said control gate switching means for switching depending on whether a reference voltage is impressed or not impressed to the control gate line.

4. Nonvolatile memory in accordance with claim 3 wherein, each of said memory gate switching means further switches depending on whether the reference voltage, which is impressed or not impressed to the control gate line, is impressed or not impressed to the corresponding memory gate line.

5. Nonvolatile memory in accordance with claim 3 further comprising, first selecting means for each of said lines of the matrix, said first selecting means for controlling the corresponding drain switching means by receiving first selecting input, said first selecting means using the first selecting input for at least one condition of controlling the corresponding memory gate switching means, and second selecting means for each of said columns of the matrix, said second selecting means for controlling the corresponding source switching means and corresponding control gate switching means by receiving second selecting input.

6. Nonvolatile memory in accordance with claim 3 wherein, all of the control gate switching means turn on when there is no first selecting input applied to any columns of the matrix, thereby the reference voltage being impressed to the control gate lines.

7. Nonvolatile memory in accordance with claim 1 wherein, the control gates of the nonvolatile memory devices in the same columns of the matrix are connected to the corresponding control gate lines through the corresponding control gate switching means.

8. Nonvolatile memory in accordance with claim 7 wherein, a read or write operation for a selected nonvolatile memory device is carried out by turning on the control gate switching means in the column having the selected nonvolatile memory device and turning off the other control gate switching means.

9. Nonvolatile memory in accordance with claim 1 wherein, the memory gates of the nonvolatile memory devices in the same lines of the matrix are connected to the corresponding memory gate line through the corresponding memory gate switching means.

10. Nonvolatile memory in accordance with claim 9 wherein, a write operation for a selected nonvolatile memory device is carried out by turning on the memory gate switching means in the column having the selected nonvolatile memory device and turning off other memory gate switching means.

11. Nonvolatile memory in accordance with claim 9 wherein, a read operation for a selected nonvolatile memory device is carried out by turning off the memory gate switching means in the column having the selected nonvolatile memory device and turning on other memory gate switching means.

12. Nonvolatile memory in accordance with claim 1 further comprising, drain switching means for each of said first drain lines, each of said drain switching means for switching depending on whether the corresponding first drain line is connected or not connected to current judgment means for drain current through the second unified drain line, memory gate switching means for each of said memory gate lines, each of said memory gate switching means for switching depending on whether a writing voltage of H level or L level is impressed or not impressed to the corresponding memory gate line, source switching means for each of said source lines, each of said source switching means for switching depending on whether a reference voltage is impressed or not impressed to the corresponding source line, and control gate switching means for each of said control gate lines, each of said control gate switching means for switching depending on whether said reference voltage is impressed or not impressed to the corresponding control gate line.

13. Nonvolatile memory in accordance with claim 12 wherein, each of said memory gate switching means further switches depending on whether the reference voltage, which is impressed or not impressed to the source line and to the control gate line, is impressed or not impressed to the corresponding memory gate line.

14. Nonvolatile memory in accordance with claim 12 further comprising, first selecting means for each of said lines of the matrix, said first selecting means for controlling the corresponding drain switching means by receiving first selecting input, said first selecting means using the first selecting input for at least one condition of controlling the corresponding memory gate switching means, and second selecting means for each of said columns of the matrix, said second selecting means for controlling the corresponding source switching means and corresponding control gate switching means by receiving second selecting input.

15. Nonvolatile memory in accordance with claim 12 wherein, all of the control gate switching means turn on when there is no first selecting input applied to any columns of the matrix, thereby the reference voltage being impressed to the control gate lines.

16. Nonvolatile memory in accordance with claim 12 wherein, the control gates of the nonvolatile memory devices in the same columns of the matrix are connected to the corresponding control gate lines through the corresponding control gate switching means.

17. Nonvolatile memory in accordance with claim 16 wherein, a read or write operation for a selected nonvolatile memory device is carried out by turning on the control gate switching means in the column having the selected nonvolatile memory device and turning off the other control gate switching means.

18. Nonvolatile memory in accordance with claim 12 wherein, the memory gates of the nonvolatile memory devices in the same lines of the matrix are connected to the corresponding memory gate line through the corresponding memory gate switching means.

19. Nonvolatile memory in accordance with claim 18 wherein, a write operation for a selected nonvolatile memory device is carried out by turning on the memory gate switching means in the column having the selected nonvolatile memory device and turning off other memory gate switching means.

20. Nonvolatile memory in accordance with claim 18 wherein, a read operation for a selected nonvolatile memory device is carried out by turning off the memory gate switching means in the column having the selected nonvolatile memory device and turning on other memory gate switching means.

21. A method of using nonvolatile memory, said nonvolatile memory being formed by nonvolatile memory devices connected in a matrix of columns and lines, each of said nonvolatile memory devices including a source region, a drain region, a channel region formed between the source and the drain regions, a memory gate formed on the channel region and insulated from the channel region, a ferroelectric layer formed on the memory gate, and a control gate formed on the ferroelectric layer, said nonvolatile memory further including a first drain line which connects the drain regions of the nonvolatile memory devices in the same line of the matrix, a unified second drain line which connects at least some of the first drain lines of the matrix, a memory gate line which connects the memory gates of the nonvolatile memory devices in the same line of the matrix, a source line which connects the source regions of the nonvolatile memory devices in the same column of the matrix, and a control gate line which connects the control gates of the nonvolatile memory devices in the same column of the matrix, said method comprising the steps of:

impressing a reference voltage to a first selected one of said nonvolatile memory devices connected to one of said control gate lines and maintaining the other control gate lines at a floating status, said reference voltage being higher than zero volt and lower than voltage corresponding to established drain current, and impressing to a first state a second selected one of said nonvolatile memory devices connected to the memory gate line a voltage with value H level voltage higher than the reference voltage for polarizing the ferroelectric layer of the second selected nonvolatile memory device or impressing to a second state the second selected one of said nonvolatile memory devices connected to the memory gate line a voltage with value L level voltage lower than the reference voltage for polarizing the ferroelectric layer of the second selected nonvolatile memory device, other memory gate lines being impressed with the reference voltage, thereby carrying out a writing operation.

22. A method of using nonvolatile memory, said nonvolatile memory being formed by nonvolatile memory devices connected in a matrix of columns and lines, each of said nonvolatile memory devices including a source region, a drain region, a channel region formed between the source and the drain regions, a memory gate formed on the channel region and insulated from the channel region, a ferroelectric layer formed on the memory gate, and a control gate formed on the ferroelectric layer, said nonvolatile memory further including a first drain line which connects the drain regions of the nonvolatile memory devices in the same line of the matrix, a unified second drain line which connects at least some of the first drain lines of the matrix, a memory gate line which connects the memory gates of the nonvolatile memory devices in the same line of the matrix, a source line which connects the source regions of the nonvolatile memory devices in the same column of the matrix, and a control gate line which connects the control gates of the nonvolatile memory devices in the same column of the matrix, said method comprising the steps of:

impressing a first selected one of said nonvolatile memory devices connected to one of said control gate lines with a reference voltage and maintaining other control gate lines at a floating status, said reference voltage generating first drain current when the ferroelectric layer of the first selected nonvolatile memory device is polarized to a first state, generating second drain current when the ferroelectric layer of the first selected nonvolatile memory device is polarized to a second state and generating reference current when the ferroelectric layer of the first selected nonvolatile memory device is not polarized, maintaining a second selected one of said nonvolatile memory devices connected to one of said memory gate lines at a floating status, other memory gate lines being impressed with the reference voltage, and reading whether current capacity of the first drain line to which the first selected nonvolatile memory device is connected is larger or less than the reference current;

thereby carrying out a reading operation.

23. A method of using nonvolatile memory, said nonvolatile memory being formed by nonvolatile memory devices connected in a matrix of columns and lines, each of said nonvolatile memory devices including a source region, a drain region, a channel region formed between the source and the drain regions, a memory gate formed on the channel region and insulated from the channel region, a ferroelectric layer formed on the memory gate, and a control gate formed on the ferroelectric layer, said nonvolatile memory further including a first drain line which connects the drain regions of the nonvolatile memory devices in the same line of the matrix, a unified second drain line which connects at least some of the first drain lines of the matrix, a memory gate line which connects the memory gates of the nonvolatile memory devices in the same line of the matrix, a source line which connects the source regions of the nonvolatile memory devices in the same column of the matrix, and a control gate line which connects the control gates of the nonvolatile memory devices in the same column of the matrix, said method comprising the steps of:

carrying out a writing operation;

carrying out a reading operation;

carrying out a standby operation, said standby operation including impressing a reference voltage to all control gate lines and all memory gate lines.

24. A method of using nonvolatile memory, said nonvolatile memory being formed by nonvolatile memory devices connected in a matrix of columns and lines, each of said nonvolatile memory devices including a source region, a drain region, a channel region formed between the source and the drain regions, a memory gate formed on the channel region and insulated from the channel region, a ferroelectric layer formed on the memory gate, and a control gate formed on the ferroelectric layer, said nonvolatile memory further including a first drain line which connects the drain regions of the nonvolatile memory devices in the same line of the matrix, a unified second drain line which connects at least some of the first drain lines of the matrix, a memory gate line which connects the memory gates of the nonvolatile memory devices in the same line of the matrix, a source line which connects the source regions of the nonvolatile memory devices in the same column of the matrix, and a control gate line which connects the control gates of the nonvolatile memory devices in the same column of the matrix, said method comprising the steps of:

carrying out a writing operation by impressing a reference voltage to a first selected one of said nonvolatile memory devices connected to one of said control gate lines and maintaining the other control gate lines at a floating status, said reference voltage being higher than zero volt and lower than voltage corresponding to established drain current, and impressing to a first state a second selected one of said nonvolatile memory devices connected to the memory gate line a voltage with value H level voltage higher than the reference voltage for polarizing the ferroelectric layer of the second selected nonvolatile memory device or impressing to a second state the second selected one of said nonvolatile memory devices connected to the memory gate line a voltage with value L level voltage lower than the reference voltage for polarizing the ferroelectric layer of the second selected nonvolatile memory device, other memory gate lines being impressed with the reference voltage, thereby carrying out a writing operation;

carrying out a reading operation by impressing a first selected one of said nonvolatile memory devices connected to one of said control gate lines with a reference voltage and maintaining other control gate lines at a floating status, said reference voltage generating first drain current when the ferroelectric layer of the first selected nonvolatile memory device is polarized to a first state, generating second drain current when the ferroelectric layer of the first selected nonvolatile memory device is polarized to a second state and generating reference current when the ferroelectric layer of the first selected nonvolatile memory device is not polarized, maintaining a second selected one of said nonvolatile memory devices connected to one of said memory gate lines at a floating status, other memory gate lines being impressed with the reference voltage, and reading whether current capacity of the first drain line to which the first selected nonvolatile memory device is connected is larger or less than the reference current, thereby carrying out a reading operation; and carrying out a standby operation by a reference voltage being impressed to all control gate lines and all memory gate lines thereby carrying out a standby operation.

* * * * *

UNITED STATES PATENT AND TRADEMARK OFFICE
CERTIFICATE OF CORRECTION

PATENT NO. : 5,592,409

DATED : Jan. 7, 1997

INVENTOR(S) : Nishimura et al.

It is certified that error appears in the above-identified patent and that said Letters Patent is hereby corrected as shown below:

In the Abstract, line 8, insert --the-- after the word "with".

In column 2, line 11, insert --the-- after the word "in"; line 5, insert --the-- after the word "in"; line 19, insert --the-- after the word "in"; line 22, insert --the-- after the word "in".

In column 4, line 11, "On" should read --On-- (not zero); line 5, "a" should read --$\alpha$--; line 25, "an" should read --the--; line 3, "an" should read --the--; line 36, "P" should read --$\beta$--; line 1, "P" should read --$\beta$--.

In column 5, line 18, insert --,-- after the letters "$MGL_2$".

In column 6, line 12, "$I_{OMAX/2}$" should read --$I_{OMAX}/2$--; line 14, "$I_{OMAX/2}k$" should read --$I_{OMAX}/2k$--; line 48, insert --the-- after the word "in"; line 32, "becomes" should read become--; line 39, delete "by" before the word "from"; line 59, "IO" should read --Io--; line 63, insert --the-- after "in";

UNITED STATES PATENT AND TRADEMARK OFFICE
CERTIFICATE OF CORRECTION

PATENT NO. : 5,592,409

DATED : Jan. 7, 1997

INVENTOR(S) : Nishimura et al.

It is certified that error appears in the above-identified patent and that said Letters Patent is hereby corrected as shown below:

In column 7, line 26, "resist or" should read --resistor--.

In column 8, line 37, insert --to-- after the word "referred"; ine 39, insert --to-- after the word "referred"; line 41, delete 37" after the word "and".

In column 11, line 57, "$V_{ref}$" should read --$V_{ref'}$--; line 58, $V_{ref}$" (second occurrence) should read --$V_{ref'}$--; line 60, "$V_{ref}$" hould read --$V_{ref'}$--; line 61, "$V_{ref}$" should read --$V_{ref''}$--.

In column 13, line 3, "(see)" should read --(see ⑧)--; line 5, (see)" should read --(see ⑦)--; line 25, "(see)" should read -(see ⑧)--; line 26, "(see)" should read --(see ⑦)--.

Signed and Sealed this

Fourth Day of November, 1997

BRUCE LEHMAN

*Attesting Officer*        *Commissioner of Patents and Trademarks*